United States Patent
Stainbrook et al.

(10) Patent No.: US 10,644,723 B2
(45) Date of Patent: May 5, 2020

(54) COMPONENT-EFFICIENT CYCLIC-REDUNDANCY-CHECK-CODE-COMPUTATION CIRCUIT

(71) Applicant: Western Digital Technologies, Inc., San Jose, CA (US)

(72) Inventors: Martin Daniel Stainbrook, Lake Stevens, WA (US); Michael Ivan Thompson, Colfax, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 110 days.

(21) Appl. No.: 15/954,101

(22) Filed: Apr. 16, 2018

(65) Prior Publication Data

US 2019/0319636 A1 Oct. 17, 2019

(51) Int. Cl.
H03M 13/00 (2006.01)
H03M 13/09 (2006.01)
H03M 13/15 (2006.01)

(52) U.S. Cl.
CPC ......... *H03M 13/09* (2013.01); *H03M 13/157* (2013.01); *H03M 13/616* (2013.01)

(58) Field of Classification Search
None
See application file for complete search history.

(56) References Cited

U.S. PATENT DOCUMENTS

| | | | | |
|---|---|---|---|---|
| 8,225,187 B1* | 7/2012 | Schultz | ............... | G06F 11/1004 714/807 |
| 2004/0250193 A1* | 12/2004 | Cavanna | ............. | H03M 13/091 714/758 |
| 2005/0005224 A1* | 1/2005 | Ridgeway | ........... | H03M 13/091 714/758 |
| 2006/0067365 A1* | 3/2006 | Venkataramana | .... | H03M 13/09 370/474 |

(Continued)

OTHER PUBLICATIONS

R. J. Glaise, "A two-step computation of cyclic redundancy code CRC-32 for ATM networks," in IBM Journal of Research and Development, vol. 41, No. 6, pp. 705-709, Nov. 1997.doi: 10.1147/rd.416.0705 (Year: 1997).*

(Continued)

*Primary Examiner* — Daniel F. McMahon

(57) ABSTRACT

With CRC-code-computation logic used in electronic-communications hardware, many current implementations employ a number n of XOR matrices equal to the number of bytes in the fundamental data unit, or word, operated on by the CRC-code-computation logic. As the size, in bytes, of the fundamental-data-unit increases, due to increases in the widths of internal data-transmission components, the number n of XOR matrices in CRC-code-computation logic has correspondingly increased. A component-efficient CRC-code-computation logic employs message-padding logic in order to compute CRC codes using only a single XOR matrix. The message-padding logic takes advantage of certain characteristics of CRC codes to transform original input messages having lengths, in bytes, that are not evenly (Continued)

divisible by the length of the fundamental data unit into messages that are evenly divisible by the length of the fundamental data unit by prepending padding bytes to the original messages.

20 Claims, 28 Drawing Sheets

(56) References Cited

U.S. PATENT DOCUMENTS

| | | | | |
|---|---|---|---|---|
| 2008/0307288 A1* | 12/2008 | Ziesler | ................ | H03M 13/091 |
| | | | | 714/758 |
| 2012/0173952 A1* | 7/2012 | Kumar K | ............ | H03M 13/091 |
| | | | | 714/758 |
| 2015/0248323 A1* | 9/2015 | Barner | ................ | G06F 11/1004 |
| | | | | 714/807 |

OTHER PUBLICATIONS

H. M. Ji and E. Killian, "Fast parallel CRC algorithm and implementation on a configurable processor," 2002 IEEE International Conference on Communications. Conference Proceedings. ICC 2002 (Cat. No. 02CH37333), New York, NY, USA, 2002, pp. 1813-1817 vol.3.doi: 10.1109/ICC.2002.997161 (Year: 2002).*

* cited by examiner $$\begin{array}{r}
x^5 + x^4 + x^3 + x + 1 \\
x^2 + 1 \overline{\smash{\big)}\, x^7 + x^6 + x^4 + x^2} \\
\underline{x^7 + x^5} \\
x^6 - x^5 + x^4 \\
\underline{x^6\phantom{-x^5} + x^4} \\
-x^5 \phantom{+x^4} + x^2 \\
\underline{x^5 + x^3} \\
-x^3 + x^2 \\
\underline{x^3 + x} \\
x^2 - x \\
\underline{x^2 + 1} \\
-x - 1 = 11
\end{array}$$

— 302

304 —
$1 + 1 = 0 \pmod 2$ — 306
$x^5 = -x^5 = 1\ 0\ 0\ 0\ 0\ 0$
$2x = (1 + 1) \cdot x = 0$ — 308

310 $\begin{cases} \{\ldots -4, -2, 0, 2, 4, \ldots\} \bmod (2) = \{\ldots 0, 0, 0, 0, 0, \ldots\} \\ \{\ldots -5, -3, -1, 1, 3, 5, \ldots\} \bmod (2) = \{\ldots 1, 1, 1, 1, 1, 1, \ldots\} \end{cases}$

FIG. 3

COMPONENT-EFFICIENT CYCLIC-REDUNDANCY-CHECK-CODE-COMPUTATION CIRCUIT

TECHNICAL FIELD

The current document is directed to electronic-communications hardware and, in particular, to an economical implementation of a cyclic-redundancy-check-code-computation circuit that uses fewer transistors and other active and passive circuit components than commonly employed in cyclic-redundancy-check-code-computation circuits.

BACKGROUND

Cyclic-redundancy-check ("CRC") codes have been employed since the 1960s for detecting errors in transmitted data and data that is stored on, and retrieved from, data-storage devices. In general, CRC codes can be used to determine whether data has changed as a result of any types of operations performed on the data or as a result of the passage of time. Prior to transmission or storing a block of data, a CRC code is computed for the data and the CRC code is included in the data. Following transmission of the data or retrieval of the data from a storage device, the CRC code is recomputed and compared with the CRC code included in the data. When the CRC code included in the data is identical to the recomputed CRC code, there is a relatively high probability that the data has not been corrupted by transmission or storage. There is a low probability that, despite the CRC code included in the data matching the recomputed CRC code, data corruption undetectable by the CRC method has occurred. The probability of undetected data corruption can be decreased by increasing the length of the computed CRC code and/or by using more effective CRC-code-generation methods, including using a more effective CRC polynomial, discussed below.

Initially, CRC codes were computed by programs or routines, including by low-level operating-system routines. However, as the bandwidths of electronic communications technologies have increased, CRC-code computation is now moving to hardware-implemented CRC-code-computation logic, which can generally compute CRC codes more quickly and efficiently than computer programs or routines, in part by employing parallel computation. However, with ever increasing electronic-communications bandwidths, the width of the fundamental unit of data, or word length, for which CRC codes are computed has also increased, resulting in a correspondingly dramatic increase in the number of circuit components, including transistors, needed to implement CRC-code-computation logic. These increases result in increasingly costly CRC-code-computation circuits and may result in slower CRC-code computation. For these reasons, designers, manufacturers, vendors, and users of CRC-code-computation logic continue to seek more efficient implementations in order to continue to track the rapid evolution of electronic communications and computational systems.

SUMMARY

The current document is directed to component-efficient CRC-code-computation logic used in electronic-communications hardware. Many current implementations employ a number n of XOR matrices equal to the number of bytes in the fundamental data unit, or word, operated on by the CRC-code-computation logic. As the size, in bytes, of the fundamental-data-unit increases, due to increases in the widths of internal data-transmission components, the number n of XOR matrices in CRC-code-computation logic has correspondingly increased. The currently disclosed component-efficient CRC-code-computation logic employs message-padding logic in order to compute CRC codes using only a single XOR matrix. The message-padding logic takes advantage of certain characteristics of CRC codes and CRC-code generation methods to transform original input messages having lengths, in bytes, that are not evenly divisible by the length of the fundamental data unit into messages that are evenly divisible by the length of the fundamental data unit by prepending padding bytes to the original messages.

BRIEF DESCRIPTION OF THE DRAWINGS

FIG. 3 shows an equivalent CRC-code computation 302 for the example computation shown in FIG. 2 using symbolic polynomial modulo-2 division over GF(2).

DETAILED DESCRIPTION

Figure 1:
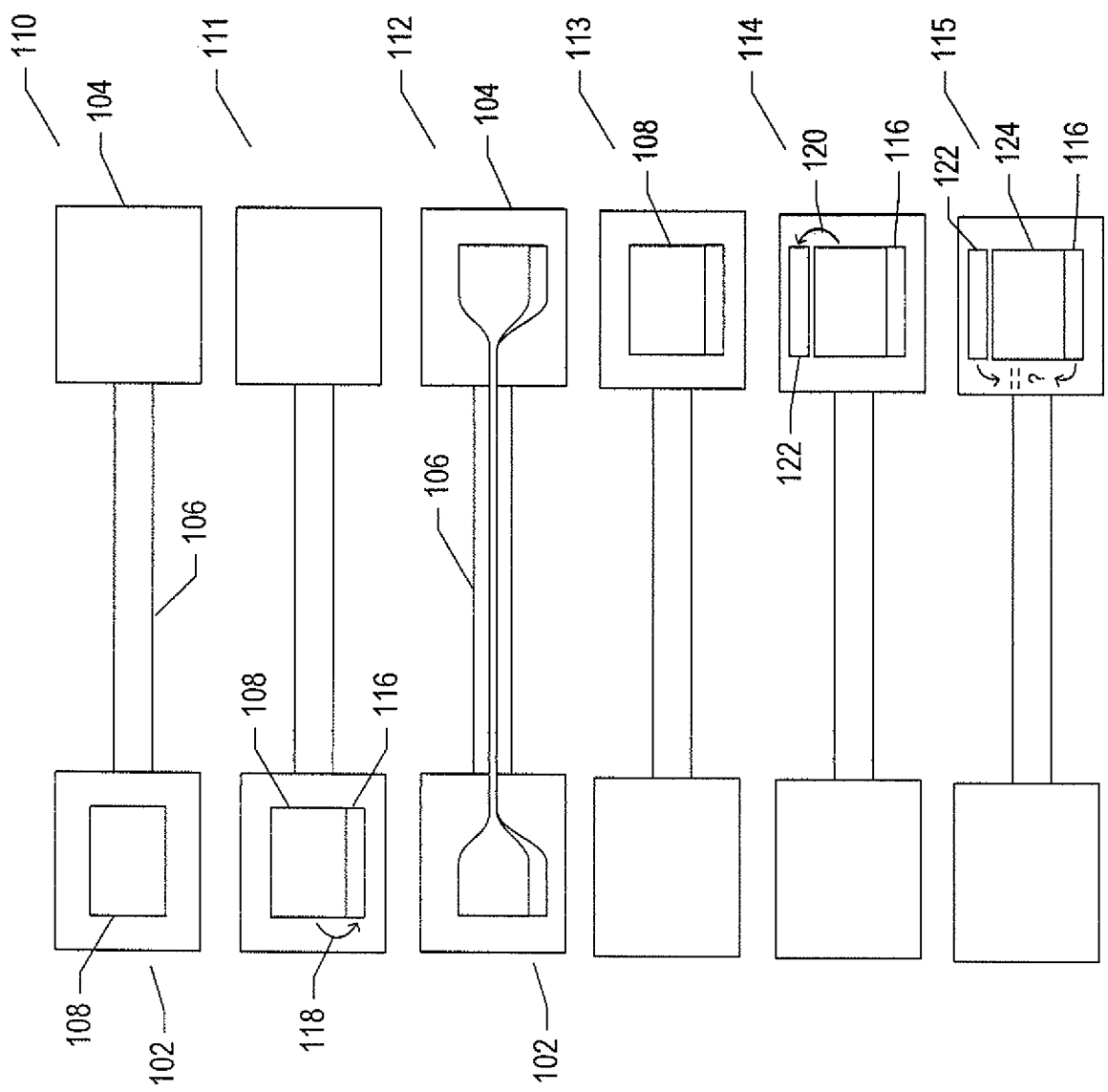
FIG. 1 illustrates use of CRC codes to detect data corruption.

FIG. 1 illustrates use of CRC codes to detect data corruption. In FIG. 1, two entities 102 and 104 are connected by an electronic-communications medium 106. A message 108 within entity 102 is to be transmitted through the electronic-communications medium to entity 104. The two entities may be any of many different types of electronic devices, including computer systems, computer-system components, smart phones, electronic-communications logic circuits embedded in semiconductor chips, and other types of entities. As mentioned above, CRC codes can also be used to detect data corruption in data that is stored within a data-storage device and subsequently retrieved from the data-storage device. In general, CRC codes can be used to determine, with high probability, whether data encoded in the data-storage devices or media has been corrupted over time or during any of various different types of operations, including transmission, storage, and retrieval. FIG. 1 shows six different snapshots, in time, of the two communicating entities to illustrate use of a CRC code to detect data corruption.

The data message 108 consists of a sequence of data-storage units encoded in some type of data-storage device or medium, such as random-access memory. Commonly, a byte, consisting of a sequence of 8 binary digits, or bits, is considered to be the smallest data-storage unit. Each byte may encode an unsigned integer in the range [0-255], a signed integer in the range [−128-127], when two's complement representation is employed, or an alphanumeric character. In a first illustrated step 110, the data message has been received or constructed by the first entity 102 and is stored in a data-storage component, such as random-access memory, within the first entity. In a second step 111, a CRC code 116 is computed from the data message 108, as indicated by arrow 118, and included in the message. In a third step 112, the data message is transmitted through the electronic communications medium 106 from the first entity 102 to the second entity 104. In a fourth step 113, message transmission is complete and the message 108 is stored within a data-storage component of the second entity. In a fifth step 114, the second entity recomputes the CRC code, as indicated by arrow 120, storing the recomputed CRC code 122 within a data-storage component. In this example, the recomputed CRC code is computed from the original message, not including the CRC code added to the original message by the first entity 116. Finally, in a sixth step 115, the second entity compares the recomputed CRC code 122 to the previously computed CRC code 116. When the two CRC codes are identical, then there is a very high probability that the data message stored within the second entity 124 is uncorrupted with respect to the data message 108 from which the first entity initially computed the CRC code added to the message.

As mentioned above, there is generally a small probability that particular types of data corruption may not be detected by the use of CRC codes. However, depending on the particular CRC-code-computation method and the length of the CRC code, the above-described method involving comparison of initially computed and recomputed CRC codes can be guaranteed to detect certain types of data corrections, including single-bit corruptions, multi-sequential-bit corruptions of up to a first threshold length, and burst errors, in which a string of 0 bits of up to a second threshold length are inserted into the message. There are a number of variations in the method discussed above. For example, in one variation, a CRC-code-like computation is carried out by the second entity on the entire received message, including the CRC code added to the message, and when the recomputed CRC code has the value 0, the message is assumed to be uncorrupted with a large probability that the assumption is true. In addition, the order in which bytes and words are extracted from a message and processed to compute a CRC code is generally irrelevant, as long as the same order is used for both the initial CRC-code computation and for subsequently recomputing the CRC code.

Figure 2:
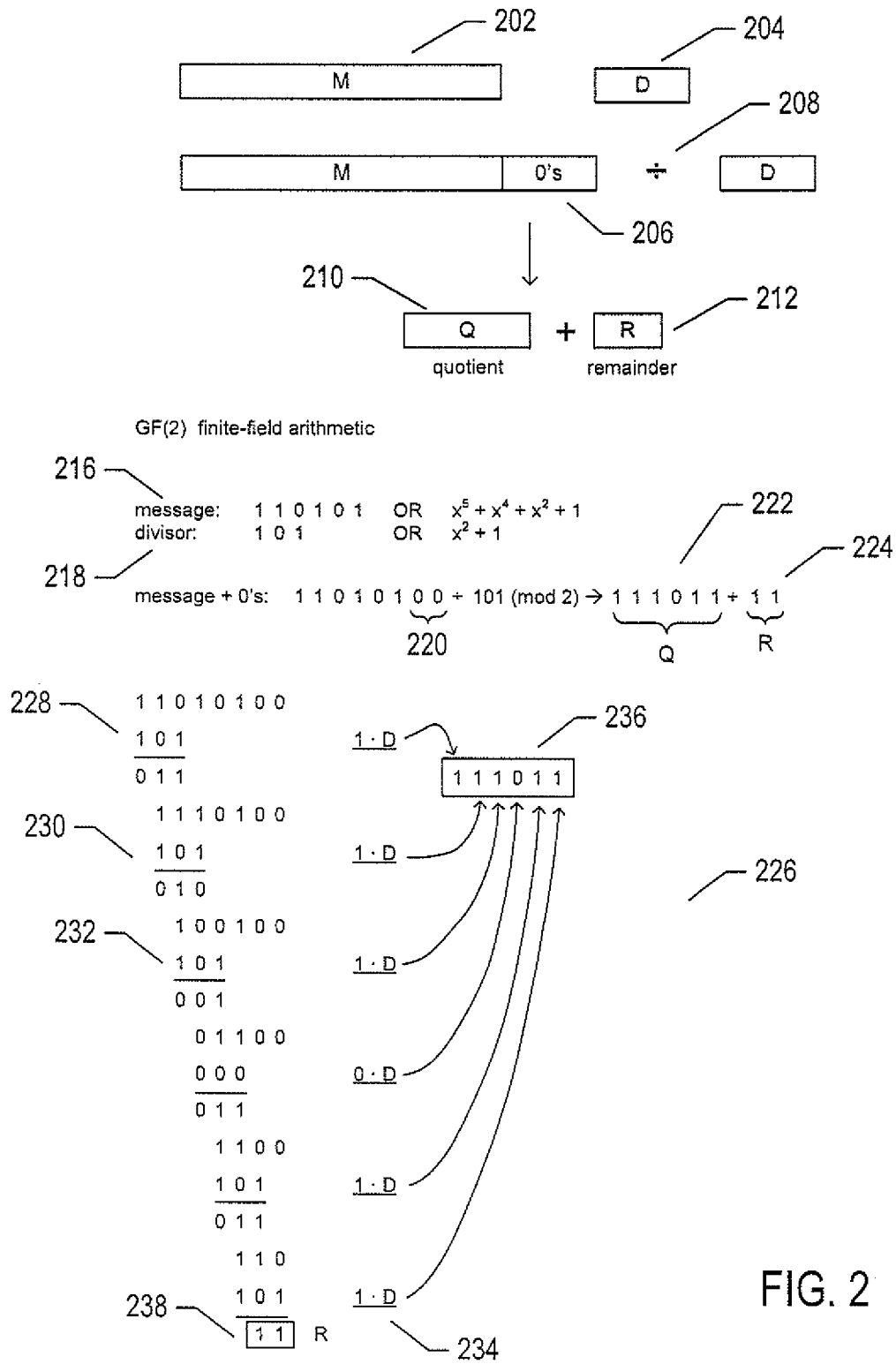
FIG. 2 illustrates computation of a CRC code.

FIG. 2 illustrates computation of a CRC code. As mentioned above, a CRC code is computed for a block of data, in many contexts referred to as a "message" 202. The CRC computation uses a divisor 204 which, as discussed below, is a polynomial. The message 202 is also considered to be a polynomial. The message is first multiplied by a degree n polynomial, $x^n$, discussed below, to introduce a sequence of 0-valued bits 206 at the end of the message. The resulting polynomial is divided by the divisor polynomial 208 to produce a quotient polynomial 210 and a remainder polynomial 212. The CRC code is, in certain implementations, the remainder polynomial 212, while, in alternative implementations, the CRC code is obtained by performing additional operations on the CRC remainder, such as an inversion operation in which the bit values are inverted. The division and multiplication operations used in CRC-code computation are finite-field arithmetic operations over the Galois field GF(2), which is equivalent to binary arithmetic operations modulo 2. In binary arithmetic, there are only to digits: 0 and 1.

FIG. 2 provides a very small numeric example of CRC-code computation. In this example, the original message is the binary, or base-2, value "110101" (216 in FIG. 2). This binary value can be considered to be an encoding of the GF(2) polynomial $a_5x^5+a_4x^4+a_3x^3+a_2x^2+a_1x^1+a_0$, where the binary digits represent the coefficients of the polynomial terms $a_i$. In other words, $a_5=1$, $a_4=1$, $a_3=0$, $a_2=1$, $a_1=0$, and $a_0=1$. The divisor 218 is the binary value "101," which is equivalent to an encoding of the GF(2) polynomial $x^2+1$. The divisor is therefore of order n=2, and the message is first multiplied by $x^2$, or "100," to introduce two 0 bits 220 at the end of the message. Division of the message multiplied by $x^2$ by the divisor, modulo 2, produces the quotient polynomial "111011" 222 and the remainder "11" 224. The CRC code is therefore "11."

The lower portion 226 of FIG. 2 illustrates a systematic, long-division-like computation of the CRC code "11" for the example message multiplied by $x^2$, "11010100." In this computation, the three-binary-digit divisor is first left aligned with the leftmost digit of the message 228. The XOR operation is then applied to each pair of aligned bits of the message and divisor. The acronym ("XOR") stands for the binary operator "exclusive OR." When both bits have the same value, the result of the XOR operation is 0. Otherwise, the result of the XOR operation is 1. Next, the divisor is right shifted with respect to the message 230 by one bit and XOR operations are again applied to the pairs of aligned bits. The right-shift and XOR steps are repeated until no further right shifts are possible. During these steps, when the leftmost bit of the divisor is aligned with a 1-valued bit in the message, the divisor polynomial "101" is used. Otherwise, the 0 polynomial "000" is used, as in the case 232. This is equivalent to multiplying the divisor by the leftmost bit of the message with which the leftmost bit of the divisor is aligned, during each step, as represented by the column of underlined values 234 in FIG. 2. The multipliers form of the quotient 236 and the remainder 238 is the results of the final pairwise XOR operations. In practical implementations, the pairwise XOR operations can be avoided when the leftmost bit of the divisor is aligned with a 0-valued bit in the message.

FIG. 3 shows an equivalent CRC-code computation 302 for the example computation shown in FIG. 2 using symbolic polynomial modulo-2 division over GF(2). Note that 1+1=0, modulo 2 (304 in FIG. 3). Note also that the encoding of a term, such as $x^5$, of a GF(2) polynomial represents both the positive term and the negative term (306 in FIG. 3). A term "2x" obtained by adding the 2 terms "x" and "x" during polynomial division is, in binary modulo-2 arithmetic, equal to 0 (308 in FIG. 3). In other words, all even numbers, whether negative or positive, are represented by the value 0 in binary modulo-2 arithmetic, while all odd numbers, whether negative or positive, have the value 1 in binary modulo-2 arithmetic (310 in FIG. 3).

Figure 4:
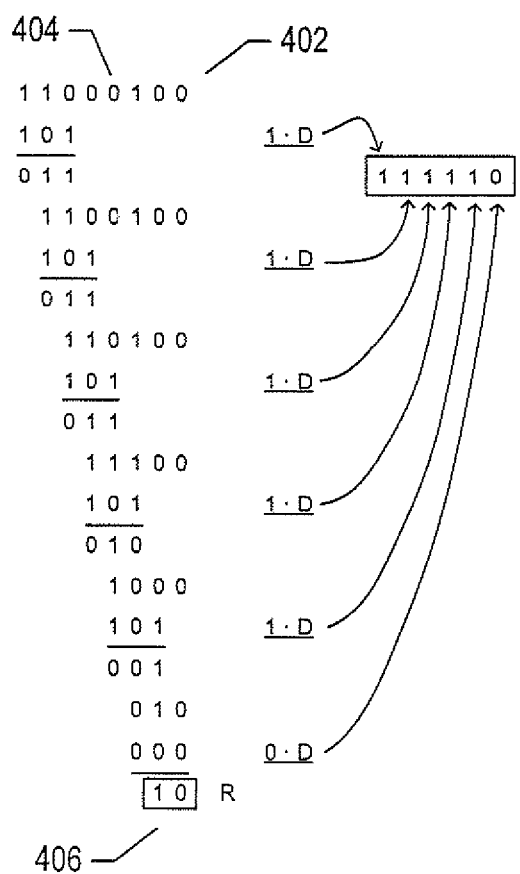
FIG. 4 illustrates the CRC-code computation for a corrupted message.

FIG. 4 illustrates the CRC-code computation for a corrupted message. The encrypted message 402 has a 0-valued bit 404 where the original message (216 in FIG. 2) has a 1-valued bit. The remainder of the modulo-2 division 406 is "10," which is the CRC code for the corrupted message and which differs from the CRC-code "11" computed for the original message (238 in FIG. 2). Thus, a comparison of the CRC code computed for the original message and the CRC code computed for the corrupted message reveals the presence of a data corruption, as discussed above with reference to FIG. 1.

Figure 5A:
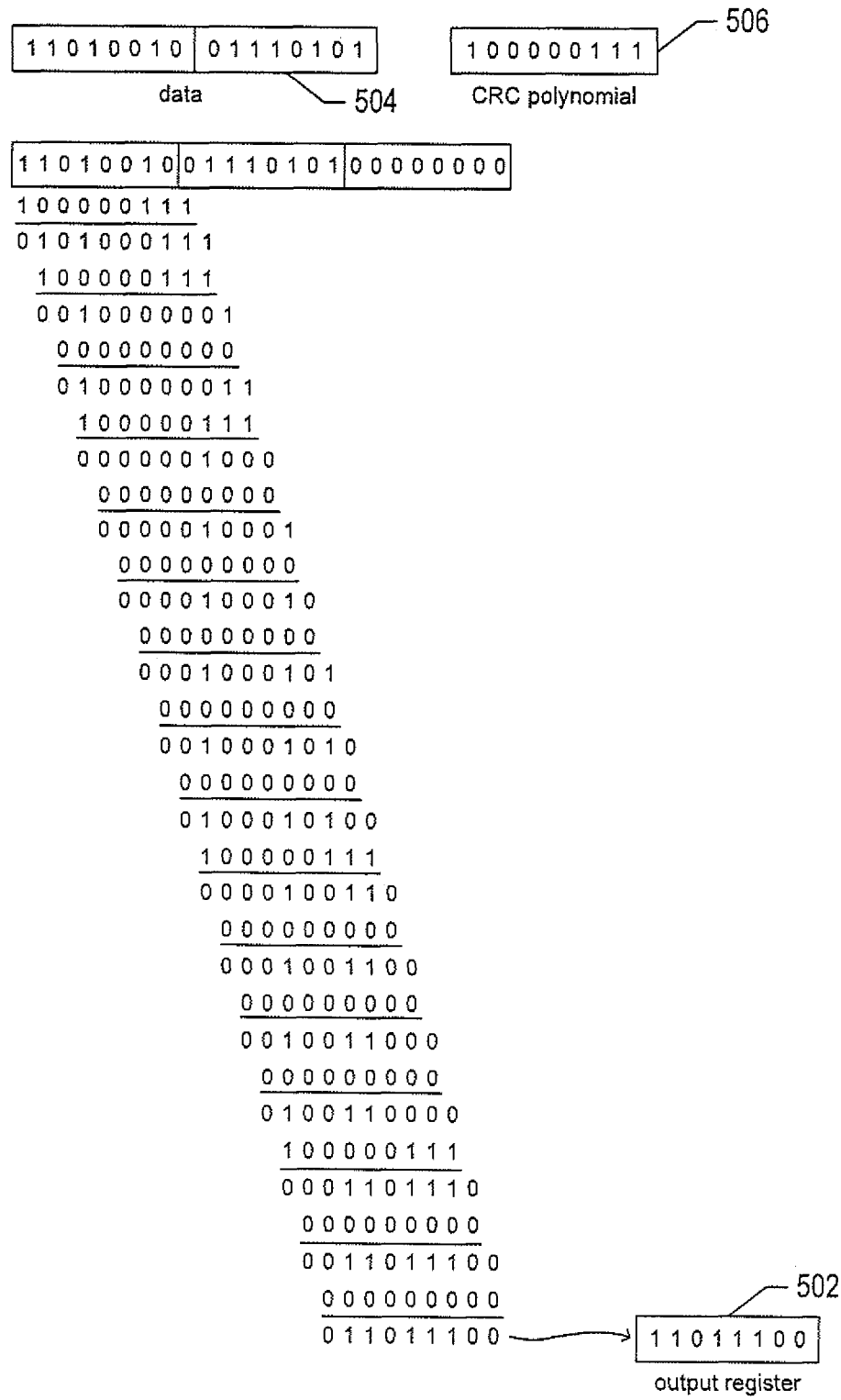
FIGS. 5A-C illustrate block-by-block CRC computation.
Figure 5B:
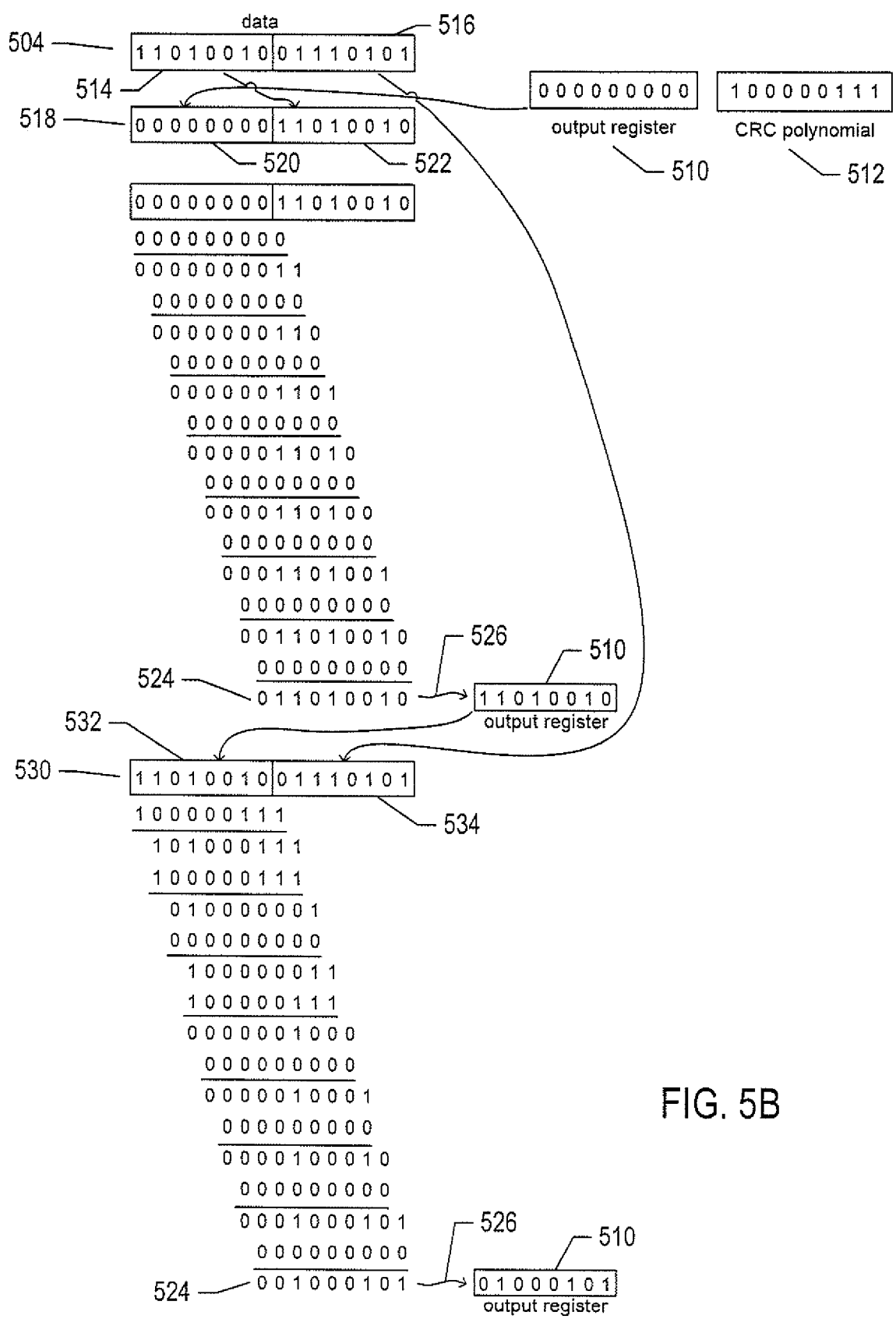
Figure 5C:
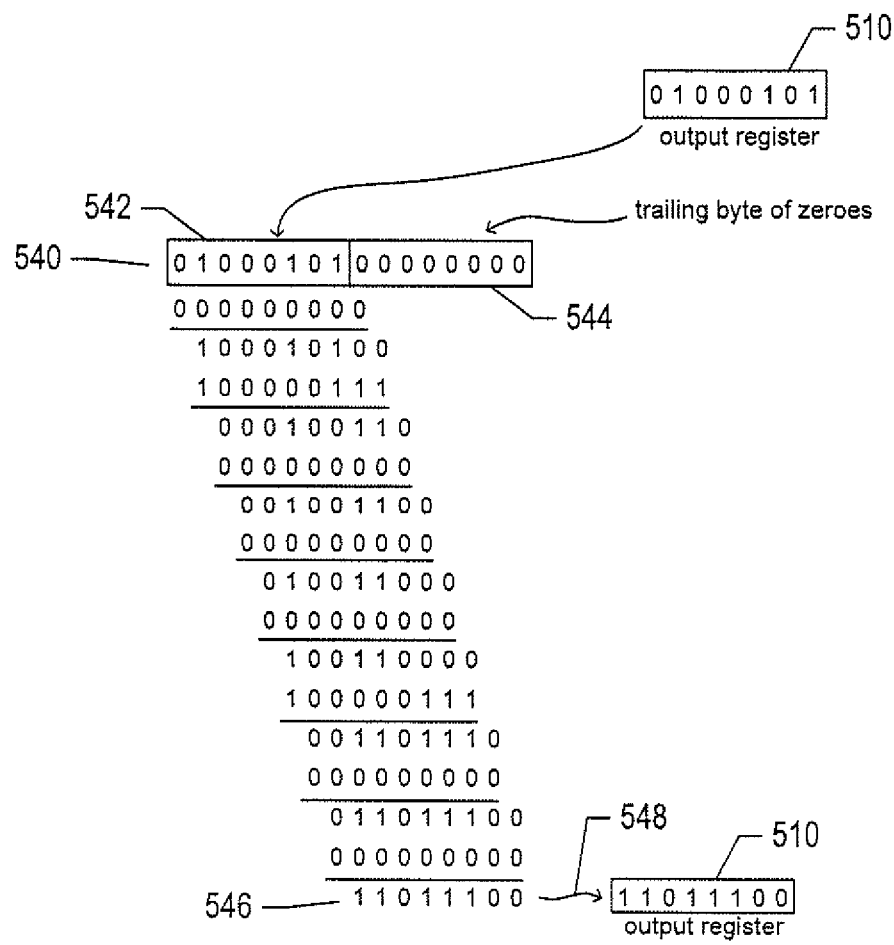

FIGS. 5A-C illustrate block-by-block CRC computation. In FIG. 5A, the CRC code 502 for a short binary message 504 is computed, using the divisor 506, by the long-division-like pairwise XOR computational method initially illustrated in FIG. 2. FIGS. 5B-C illustrate the same computational result produced by block-by-block computation. As shown in FIG. 5B, an output register 510 includes an initialization value, a block of 0-valued bits in the current example, and a second register 512 contains the divisor, or CRC polynomial. The message 504 is divided into two equally sized blocks 514 and 516. The contents of the output register are placed into the highest-order block 518 of double-sized block 520 and the highest-order block of the message 514 is placed in the lowest-order block 522 of the double-sized block 520. The double-sized block 520 is then divided modulo 2 by the divisor to produce a remainder 524 which is then placed, as indicated by arrow 526, into the output register 510. Then, a next block operation is undertaken. The contents of the output register 510 are placed into the highest-order block 530 of double-sized block 532 and the lowest block 516 of the message is placed into the lowest-order block 534 of the double-sized block 532. Then division of the double-sized block modulo 2 by the divisor is again carried out to produce the remainder 536. As indicated by arrow 538, the remainder is then placed into the output register 510. As shown in FIG. 5C, the contents of the output register 510 are placed into the highest-order block 540 of double-sized block 542 and a block of trailing 0-valued bits, equivalent to multiplying the message by $x^8$, as discussed above with reference to item 220 in FIG. 2, is placed into the lowest-order block 544 of the double-sized block 542. Division of the double-sized block modulo 2 by the divisor is then again carried out to produce the remainder 546, which is placed into the output register as the final CRC code, as indicated by arrow 548. FIGS. 5A-C show that a message can be partitioned into equally sized blocks, and the CRC code for the message computed by an iterative, block-by-block computation. The example of block-by-block computation of a CRC code is but one approach to block-by-block computation of CRC codes. There are many other approaches that can be used. The approach followed in the example of FIGS. 5B-C is used throughout the following discussion.

Figure 6A:
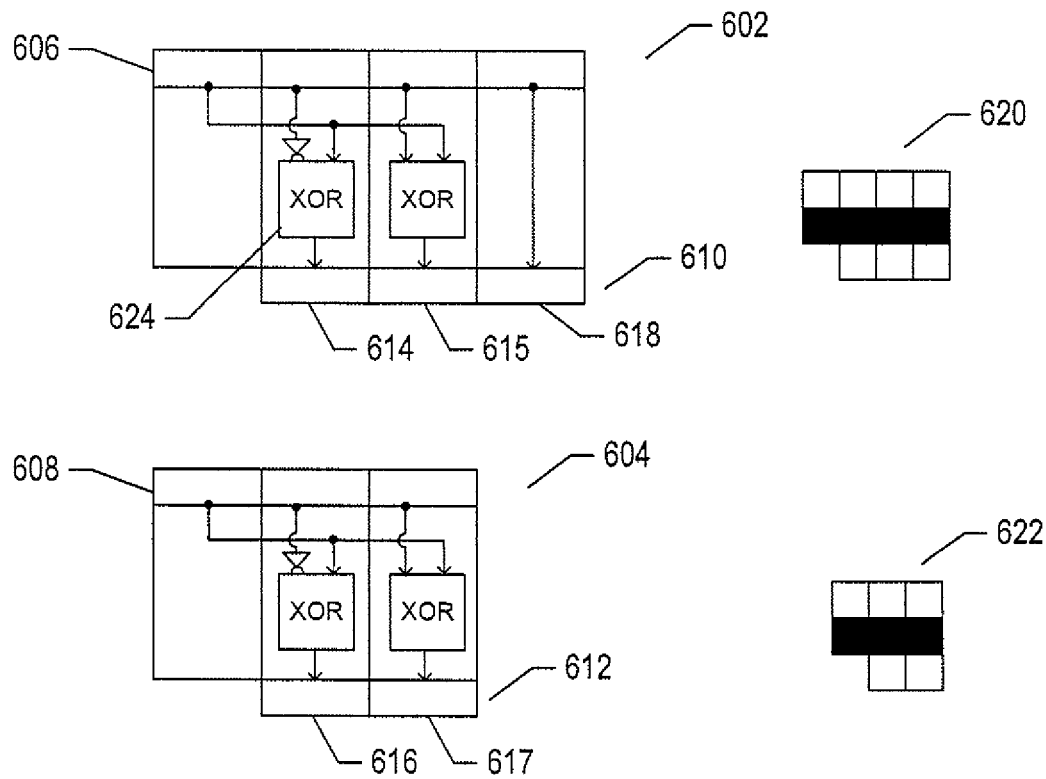
FIGS. 6A-C illustrate implementation of an XOR-matrix circuit element that is used to compute the remainder generated by modulo-2 division of a block partitioned from a message, as discussed above with reference to FIGS. 5A-C.
Figure 6B:
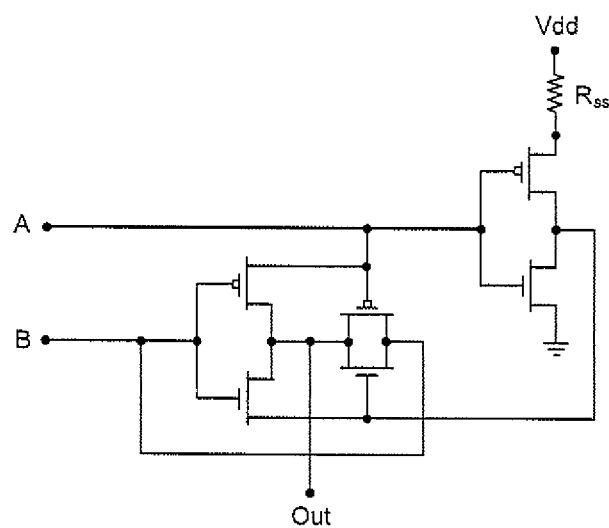
Figure 6C:
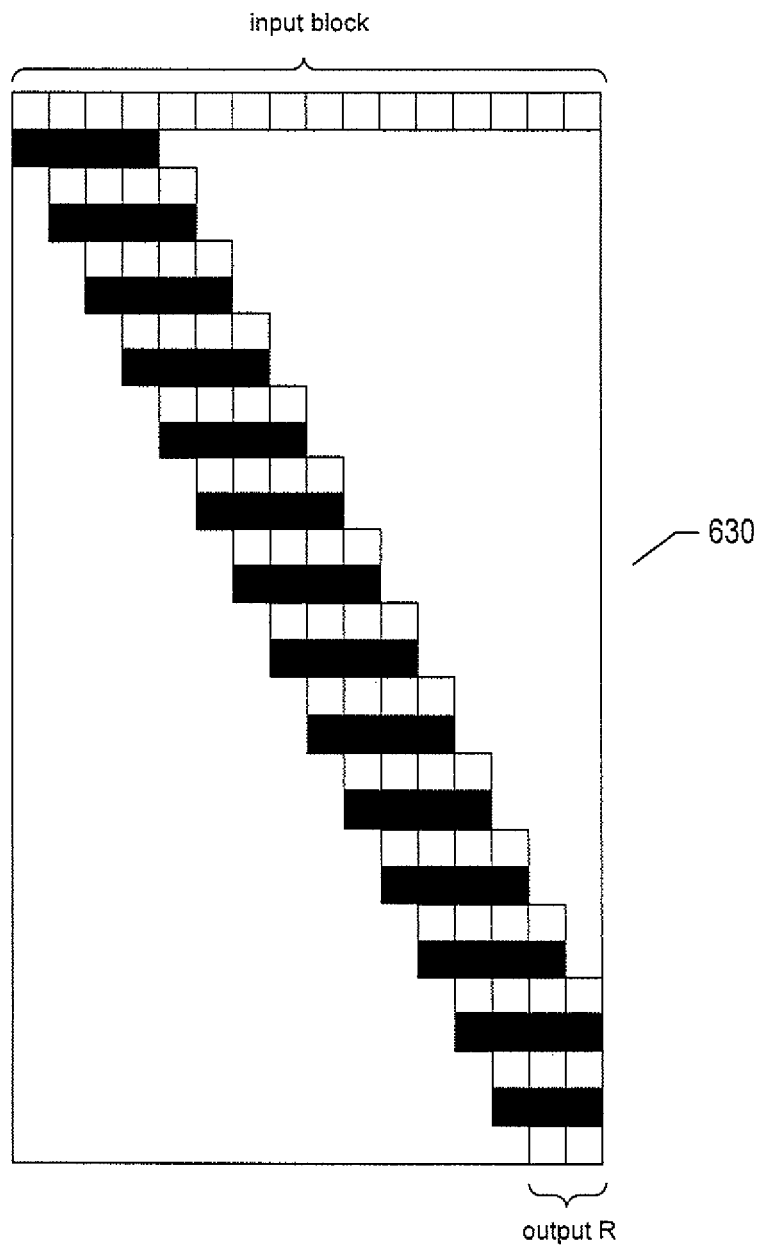

FIGS. 6A-C illustrate implementation of an XOR-matrix circuit element that is used to compute the remainder generated by modulo-2 division of a block partitioned from a message, as discussed above with reference to FIGS. 5A-C. This implementation is specific to the method of block-by-block computation of CRC codes discussed above with reference to FIGS. 5B-C. Other types of XOR matrices are used for other CRC-code computation methods, and, in fact, more complex methods that provide greater computational efficiency, and XOR matrices and logic corresponding to them, are often used in practical applications. Two different types of cells 602 and 604 used in the implementation of the XOR matrix are shown in FIG. 6A. The cells compute the pairwise XOR operations between a portion of a message and a divisor aligned with the portion of the message, as discussed above with reference to FIG. 2. The cells are designed for the divisor "101" used in the example of FIGS. 2-5C. The rows of rectangles 606 and 608 represent incoming bit values of the message and the rows of rectangles 610 and 612 represent output bit values either computed by XOR operations, in the case of outputs 614-617, or transferred unaltered from an input value, in the case of rectangle 618. The first type of cell 602 is diagrammatically represented by icon 620 and the second type of cell 604 is diagrammatically represented by icon 622 in FIG. 6C, discussed below. The rectangles labeled "XOR" in the cells, such as rectangle 624, represent XOR circuits that perform an XOR operation on the two input bit values. FIG. 6B shows a simple circuit diagram for a metal-oxide-semi-conductor-field-effector-transistor implementation of an XOR circuit. Finally, FIG. 6C illustrates an XOR-matrix circuit element 630 that can be used for the block-by-block computation illustrated in FIGS. 5B-C. FIG. 6A-C provide a simple exemplary implementation, but there alternative and more efficient implementations. In general, as in the above discussed example, the CRC polynomial is built into the XOR matrix, rather than provided as an input.

Figure 7:
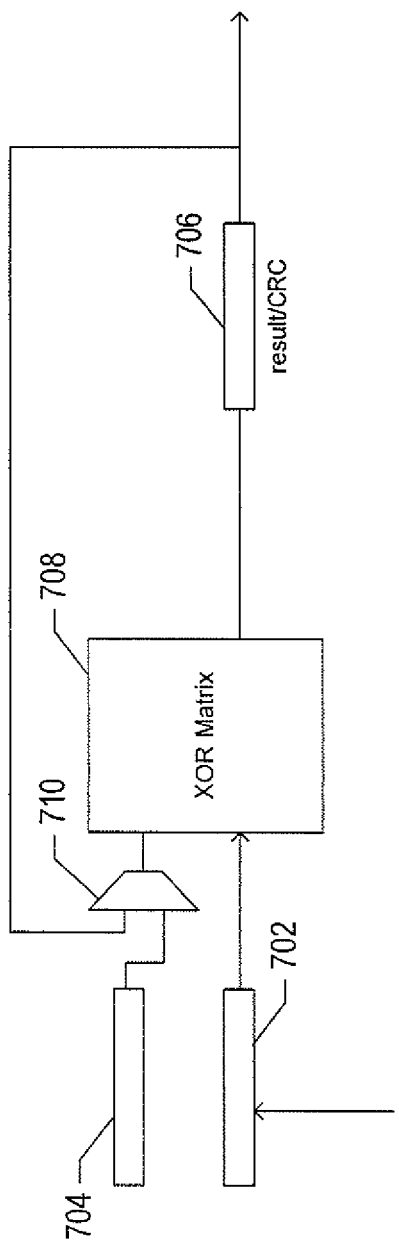
FIG. 7 illustrates a first example CRC-code-computation implementation.

FIG. 7 illustrates a first example CRC-code-computation implementation. The implementation includes a message-block-input register 702, an initialization register 704, a result register 706, an XOR matrix 708, and a two-input multiplexer 710. The initialization register 704 serves to initialize the highest-order block of an internal double-sized block, as discussed above with reference to FIG. 5B. Thus, initially, the contents of the initialization register 704 are input to the XOR matrix along with a first message block that is input from the message-block-input register During each subsequent clock interval, the remainder output from the XOR matrix is, as discussed above with reference to FIG. 5B, fed back as input to the XOR matrix along with a next message block input from the message-block-input register 702. When the final message block has been input to the XOR matrix, the CRC code is output to the result register 706.

Figure 8:
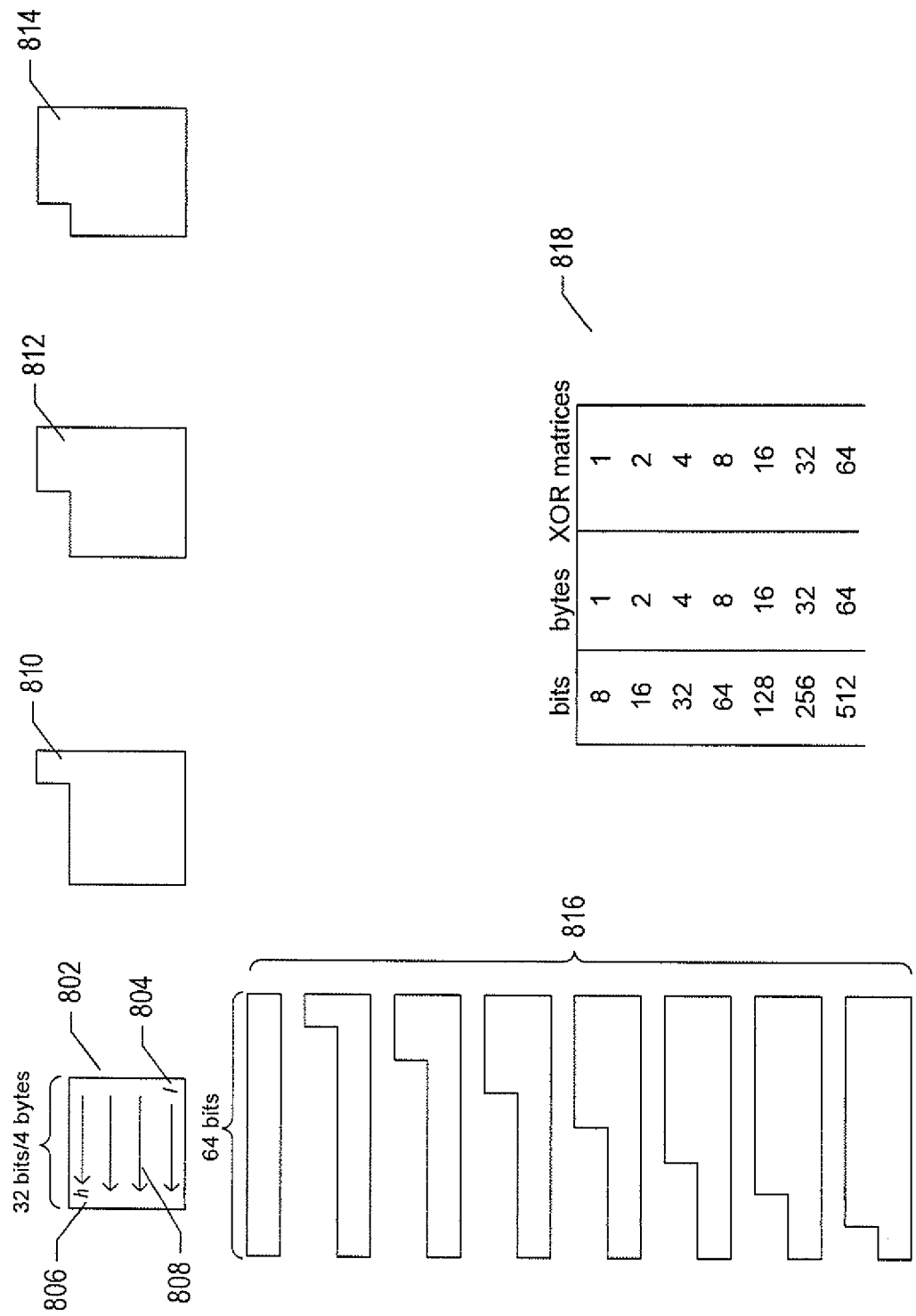
FIG. 8 illustrates uneven message lengths.

FIG. 8 illustrates uneven message lengths. Rectangle 802 represents a message encoded in a 32-bit or, equivalently, 4-byte, words. Subsequently, the term "word" is used rather than the term "block" for the unit of data storage fed to the CRC-code-computation circuit. The term "block" is subsequently used more generally to mean a sequence of bytes or words. The representation is rectangular since the message contains a total number of bytes that is evenly divisible by 4 bytes. Note that, in the current document, the ordering of bytes within a message begins with the lowest-order byte 804 in the lower right-hand corner and ends with the highest-order byte 806 in the top left-hand corner, with the sequence number of the bytes increasing in a right-to-left direction, as indicated by arrows in FIG. 8, such as arrow 808. Different orderings of bytes within messages and words can be used in different implementations, but as long as both communicating entities employ the same byte-ordering convention, the before-transmission-computed and after-transmission-computed CRC codes will be identical in the absence of message corruption.

Messages, however, may have lengths, in bytes, that are not evenly divisible by 4 bytes. For example, the final word in a message may include only a single byte 810, two bytes 812, or three bytes 814. Because an XOR matrix carries out the individual XOR operations in parallel, an XOR matrix cannot accommodate variable-sized final words. Instead, traditional CRC-code-computation circuits employ a separate XOR matrix for each possible size, in bytes, of the final word of the message. Thus, in the case of a CRC-code-computation circuit that computes a remainder from modulo-2 division of a block of 32-bit words, the CRC-code-computation circuit traditionally includes four different XOR matrices in order to handle the final possible word lengths of 1, 2, 3, and 4 bytes. Of course, in the case that the message length is guaranteed to be evenly divisible by 16 bits, or two bytes, then only two different XOR matrices are needed, rather than four, to handle final word lengths of two or four. As shown by the column of message diagrams 816 in FIG. 8, a CRC-code-computation circuit designed to compute remainders from modulo-2 division of a block of 64-bit words, the CRC-code-computation circuit traditionally includes 8 different XOR matrices in order to handle the final possible word lengths of 1, 2, 3, 4, 5, 6, 7, and 8 bytes. Table 818 in FIG. 8 illustrates the increase in XOR matrices as the word size of the blocks processed by a traditional CRC-code-computation circuit increases.

As discussed above, there are numerous problems associated with using multiple XOR matrices in a CRC-code-computation-circuit implementation. XOR-matrix implementations use very large numbers of transistors and other active and passive circuit components, with the number of active and passive circuit components increasing roughly in proportion to the square of the word size. This increase is further multiplied by the linear increase in the number of XOR matrices needed for increasing word sizes, leading to a geometric increase in the number of active and passive circuit components for traditional CRC-code-computation circuits with respect to the size of words input to the CRC-code-computation circuits. Clearly, a geometric increase in the number of active and passive circuit components results in a steep increase in manufacturing and testing costs and in power requirements. Furthermore, the geometric increase also results in longer circuit-instability periods following each parallel computation, due to the increasing number of transistors in the signal paths through the XOR matrices. Longer circuit-instability periods may, in turn, increase the number of clock cycles required for each block computation or increase the period of time between clock ticks, which offsets the gains achieved by using wider internal data-transmission media.

Figure 9:
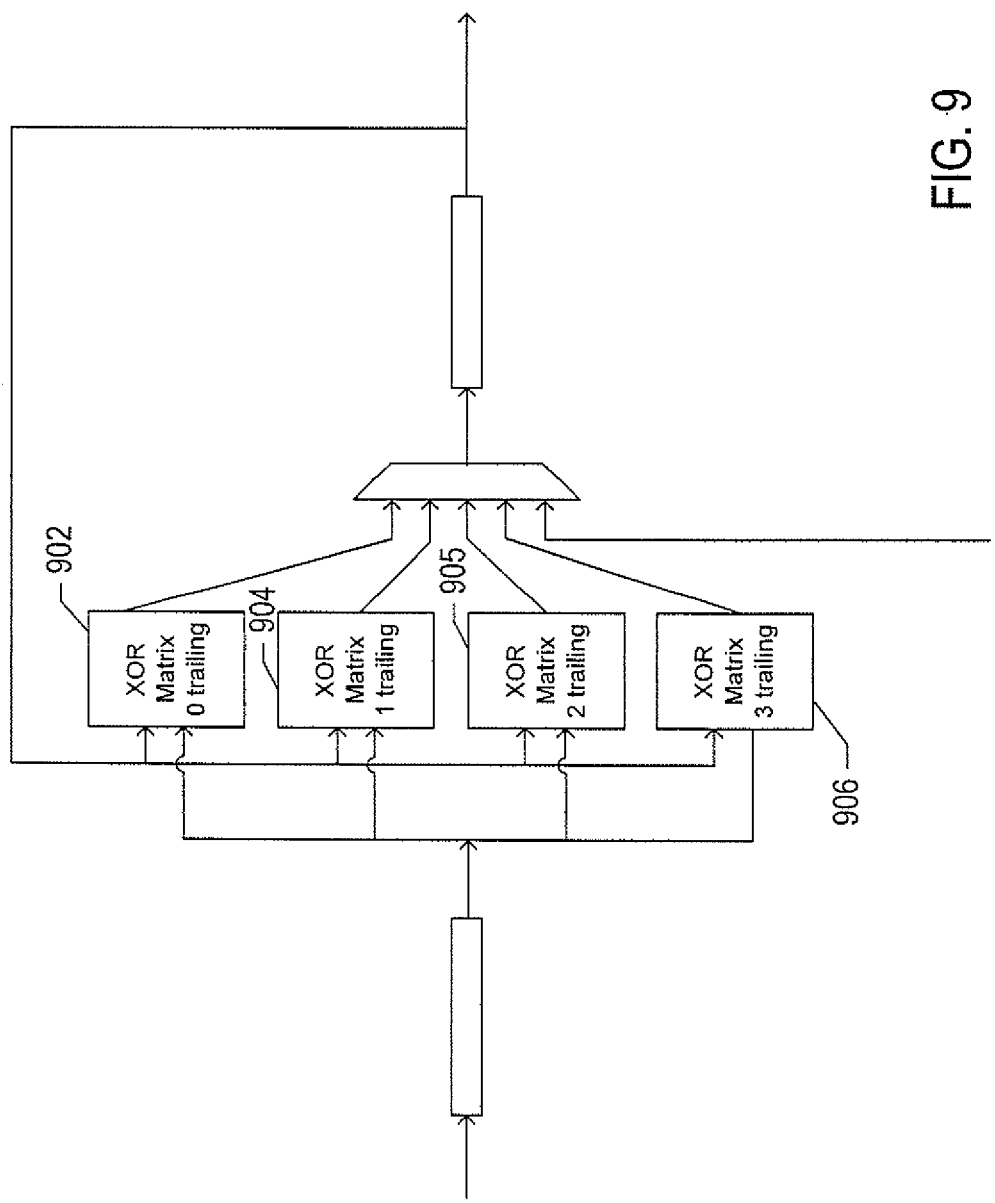
FIG. 9 illustrates a traditional implementation for a CRC-code-computation-circuit that processes blocks of 32-bit words.

FIG. 9 illustrates a traditional implementation for a CRC-code-computation-circuit that processes blocks of 32-bit words. A first XOR matrix 902 processes all but the final word in a message for messages with the lengths, in bytes, that are not evenly divisible by 4 bytes. Three additional XOR matrices 904-906 provide for processing the final word of messages having lengths that are not evenly divisible by four bytes.

Figure 10:
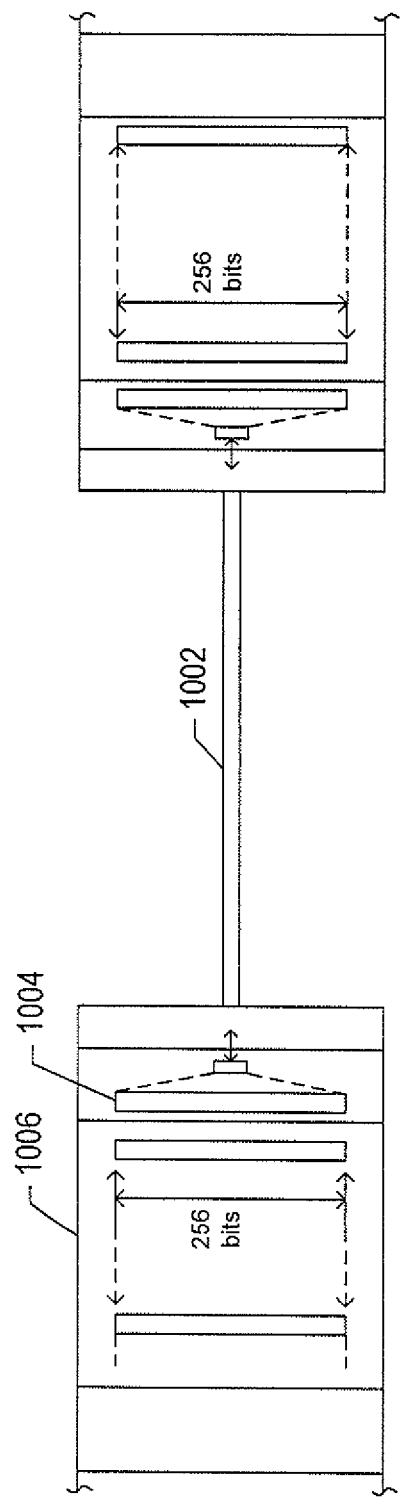
FIG. 10 illustrates the need for CRC-code-computation-circuits that process blocks of words with large lengths.

FIG. 10 illustrates the need for CRC-code-computation-circuits that process blocks of words with large lengths. Because of the increase in the bandwidths of modern of electronic-communications technologies, electronic-communications hardware devices that receive and process data input from electronic-communications media and that process and transmit data to electronic-communications media need to be implemented with increasingly wider internal communications paths in order to increase parallelism in data processing in order to keep up with the extremely high speeds of modern electronic-communications technologies. While an electronic-communications medium 1002 may transport data in serial or narrow data streams, electronic-communications hardware devices read the data into wide internal-transmission components 1004 for input to correspondingly wide internal communications media 1006 for internal transmission to processing components, including CRC-code-computation circuits.

Figure 11:
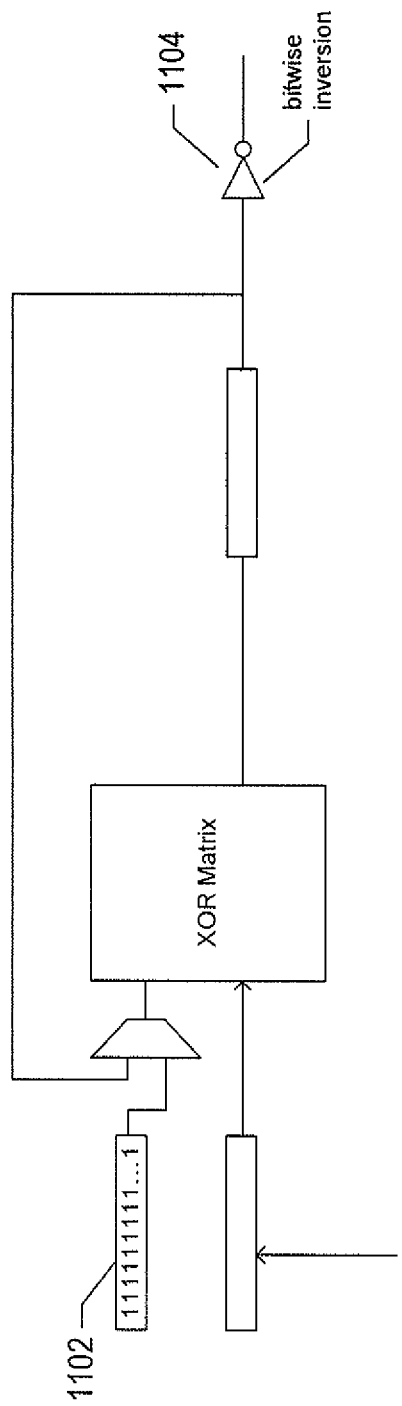
FIG. 11 illustrates several additional CRC-code-generation-implementation characteristics, using the illustration conventions used in FIG. 7 for a CRC-code-computation circuit that assumes messages of lengths evenly divisible by the word length.

FIG. 11 illustrates several additional CRC-code-generation-implementation characteristics, using the illustration conventions used in FIG. 7 for a CRC-code-computation circuit that assumes messages of lengths evenly divisible by the word length. Because computed CRC codes are insensitive to leading 0-valued bits, and because such burst errors commonly occur in electronic communications and in data storage and data retrieval, the initial value input from the initialization register 1102 is generally a block of 1-valued bits, rather than 0-valued bits. In addition, the remainder following polynomial division is generally inverted 1104. Again, providing that both communicating parties employ the same initialization and inversion conventions, the resulting CRC codes can be used for data-corruption detection, as discussed above with reference to FIG. 1.

Figure 12:
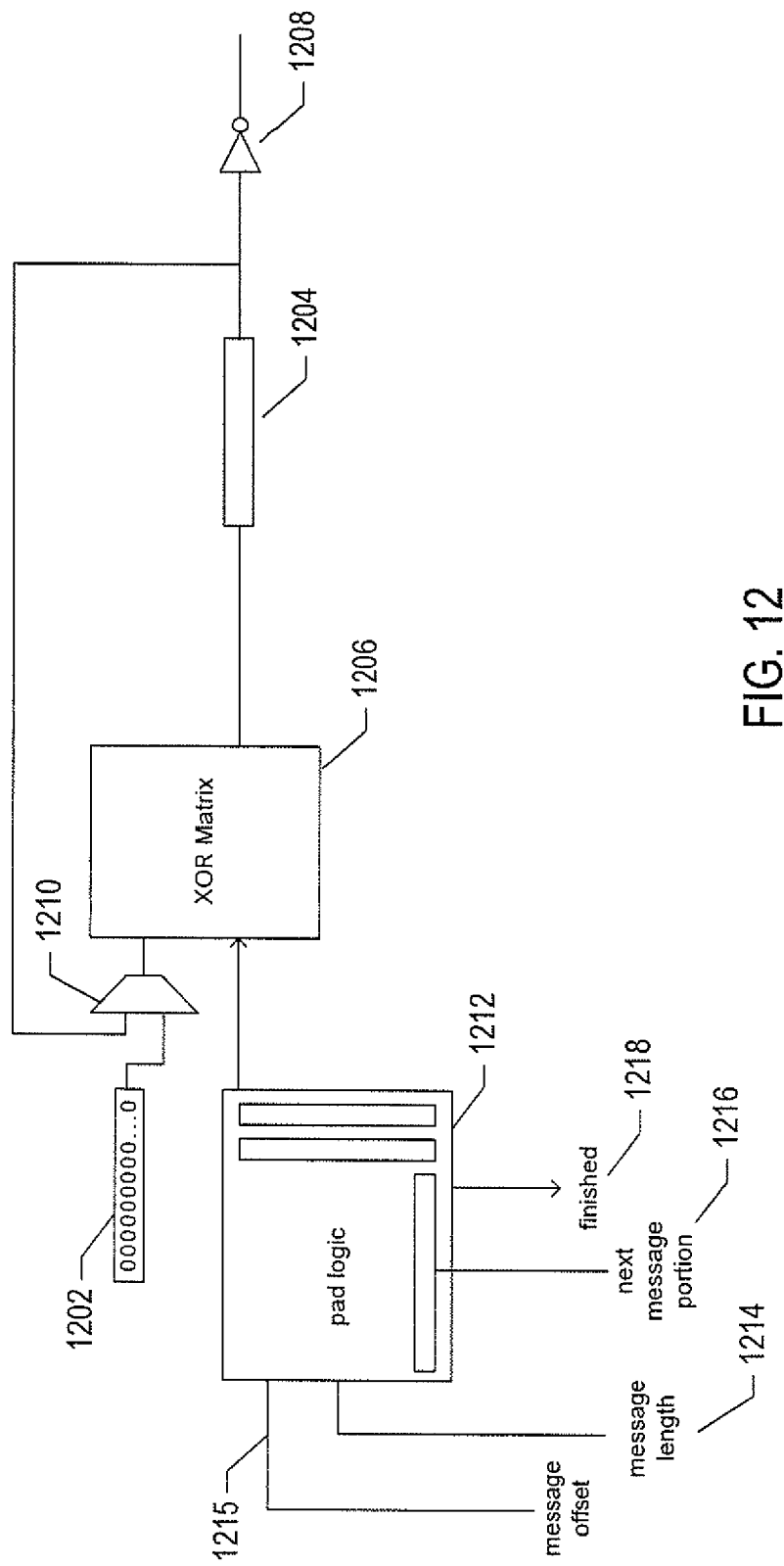
FIG. 12 illustrates one implementation of the currently disclosed CRC-code-computation circuit that employs only a single XOR matrix.

FIG. 12 illustrates one implementation of the currently disclosed CRC-code-computation circuit that employs only a single XOR matrix. This CRC-code-computation circuit includes the initialization register 1202, result register 1204, a single XOR matrix 1206, and output inverter 1208, and a two-input multiplexer 1210. However, the currently disclosed CRC-code-computation circuit includes only a single XOR matrix rather than the multiple XOR matrices needed to handle variable final word lengths, such as the CRC-code-computation circuit shown in FIG. 9. In addition, the implementation of the currently disclosed CRC-code-computation circuit shown in FIG. 12 includes a pad-logic circuit 1212 which receives, as input, the length of the message for which a CRC code is to be computed 1214, an offset for the first byte of the sequence of bytes over which the CRC code is to be generated 1215, as well as message-block input 1216. The pad-logic circuit also outputs a value 1218 indicating completion of CRC-code computation, in the example implementation. In the implementation shown in FIG. 12, the message length is first input, after which message blocks of the word length accommodated by the CRC-code-computation circuit are input during subsequent clock cycles. Once all message blocks of an input to the pad-logic circuit, the output value 1218 changes from 0 to 1 when the final CRC code is output to the result register 1204. In alternative implementations, the message length and first message block may be input, in parallel. Note that padding is generally needed even for messages that have lengths that are evenly divisible by the word length, since a special initialization value needs to be added to the message to produce a result that would be produced by using an initialization block having all 1-valued bits, although there are cases when the number of bytes needed for the special initialization value is equal to the number of additional bytes needed to guarantee that the message length is evenly divisible by the word length, in which no padding is needed.

Figure 13:
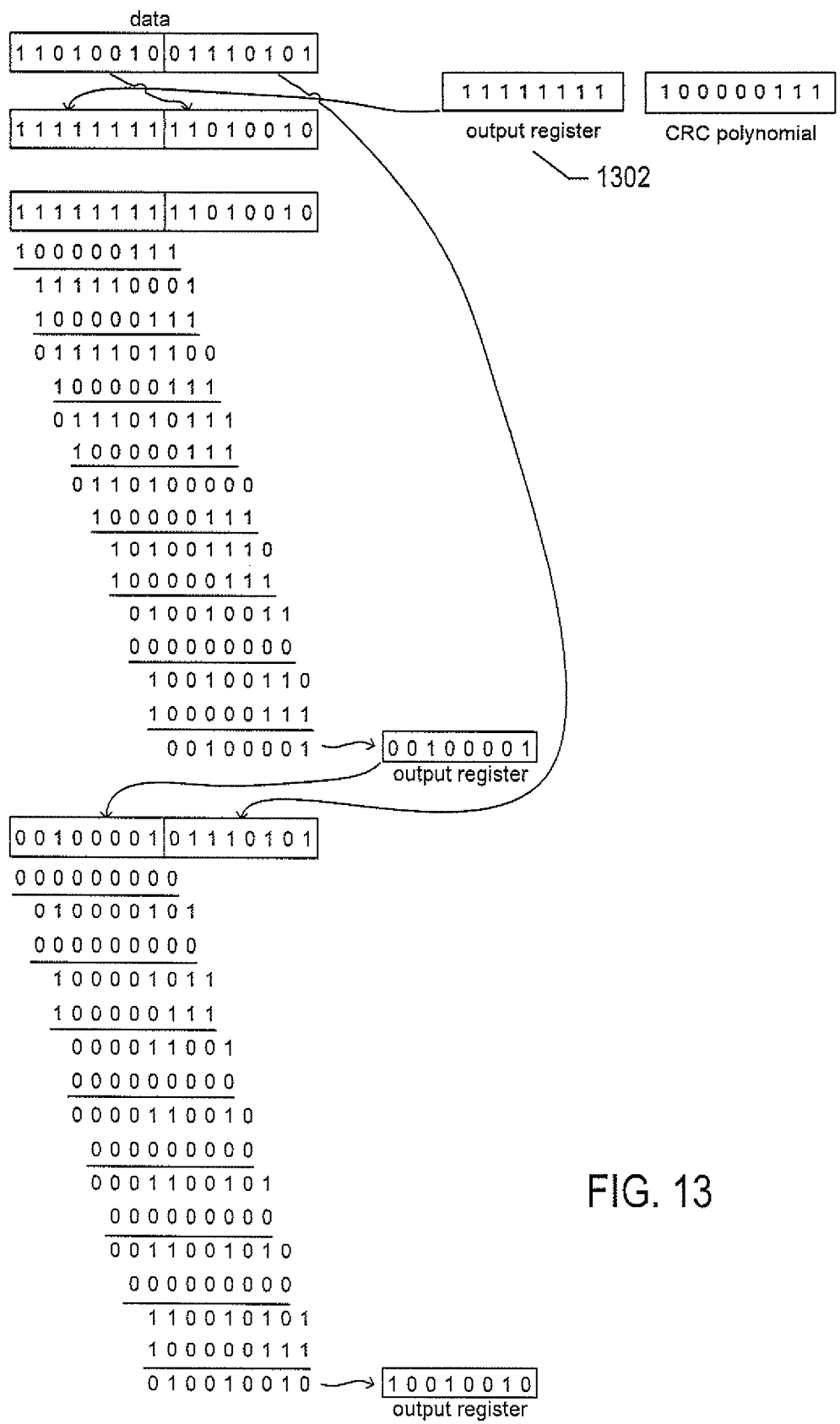
FIG. 13 shows processing of the first and second message blocks previously shown M FIG. 5B, with the exception that the output register contains a block of 1-valued initialization bits rather than a block of 0-valued initialization bits, as in FIG. 5B.
Figure 14:
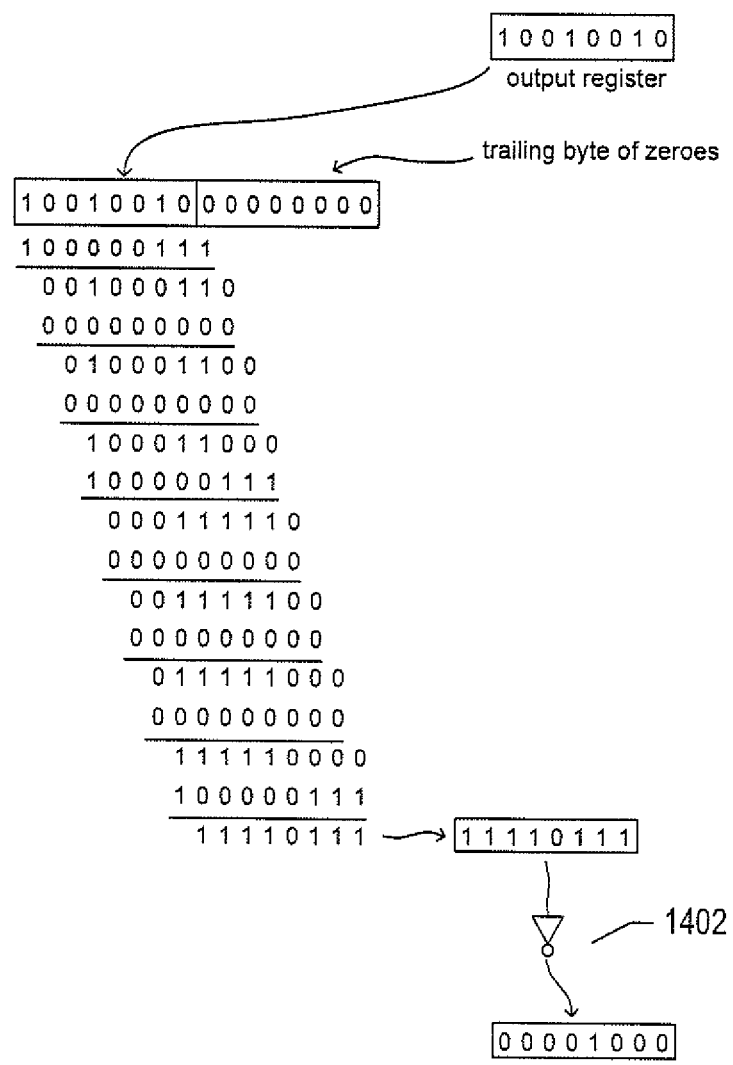
FIG. 14 shows final message processing similar to the final processing steps shown in FIG. 5C, with inversion of the output register when the processing is complete.

FIG. 13 shows processing of the first and second message blocks previously shown in FIG. 5B, with the exception that the output register 1302 contains a block of 1-valued initialization bits rather than a block of 0-valued initialization bits, as in FIG. 5B. FIG. 14 shows final message processing similar to the final processing steps shown in FIG. 5C, with inversion of the output register when the processing is complete 1402. Clearly, because different initialization values are used, the result of the computation shown in FIGS. 5B-C, "11011100," differs from the result of the computation shown in FIGS. 13-14 prior to inversion, and, of course, following inversion.

Figure 15:
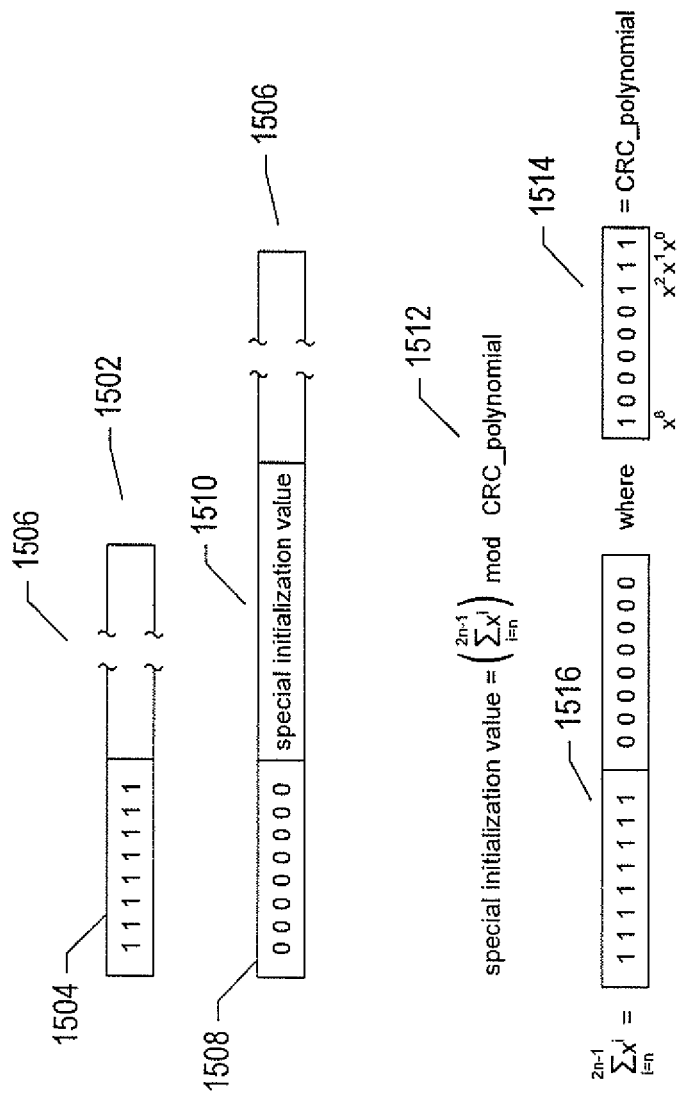
FIG. 15 illustrates a method for using a block of 0-valued bits to initialize a CRC-code computation while still producing the same result as produced when a block of 1-valued bits is used to initialize the CRC-code computation.

FIG. 15 illustrates a method for using a block of 0-valued bits to initialize a CRC-code computation while still producing the same result as produced when a block of 1-valued bits is used to initialize the CRC-code computation. The message with a prepended block of 1-valued bits 1502 is shown in FIG. 15 as the initial byte of 1-valued bits 1504 and a representation of the remainder of the message 1506. In order to use an initialization block of 0-valued bits 1508, a special initialization value 1510 is inserted following the block of 0-valued bits and before the remainder of the message 1502. The special initialization value can be computed as indicated by expression 1512 in FIG. 15 for the example CRC-code-computation method used as an example in the current discussion. For the CRC polynomial 1514, or divisor, used in the examples of FIGS. 5A-C and 13-14, the expression $$\sum_{i=n}^{2n-1} x^i$$

is represented, in bits, by the two bytes 1516.

Figure 16:
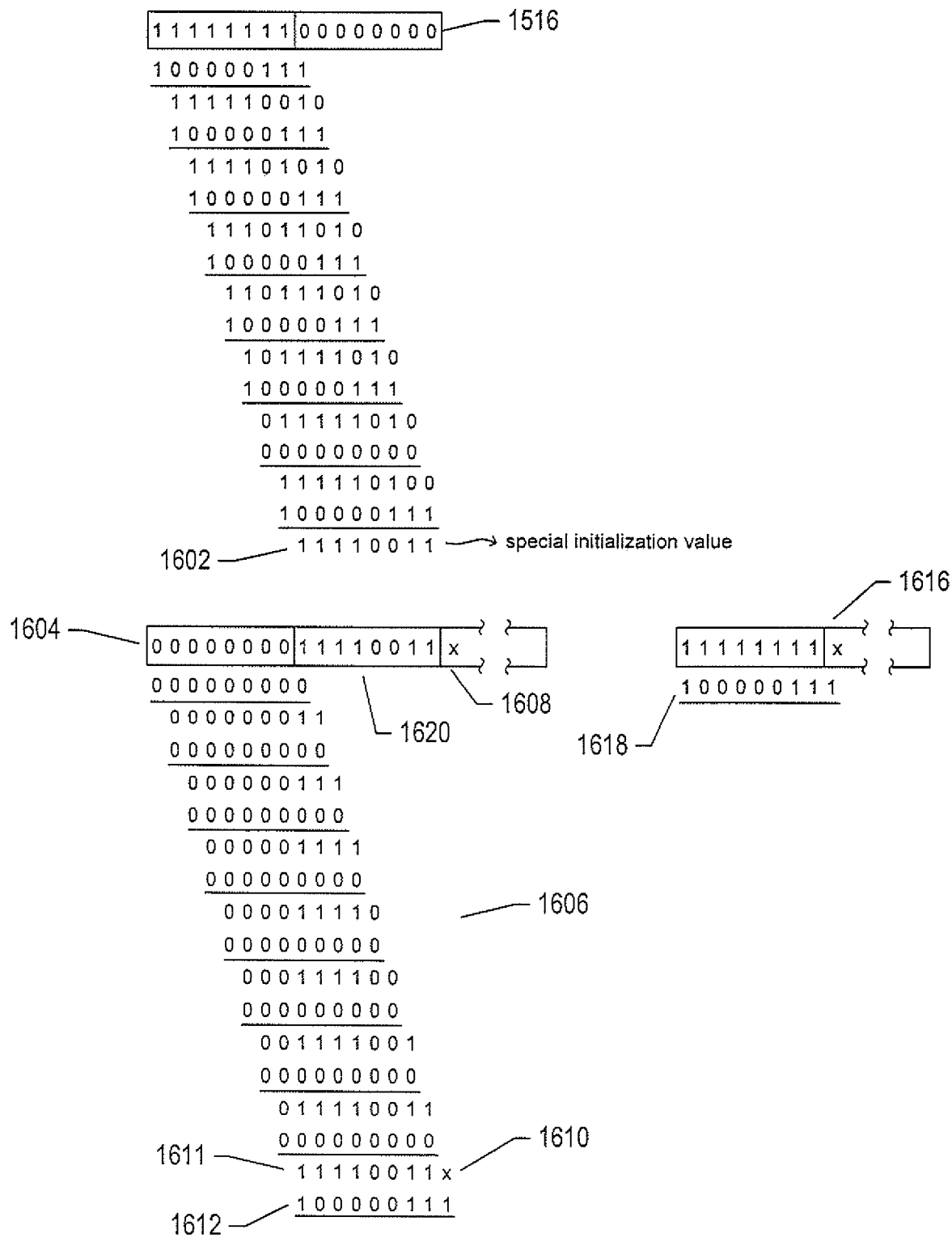
FIG. 16 illustrates computation of the special initialization value for the CRC polynomial used in the examples of FIGS. 5A-C and 13-14 as well as the effect of inserting the special initialization value between a block of 0-valued initialization bits and the remainder of the message.

FIG. 16 illustrates computation of the special initialization value for the CRC polynomial used in the examples of FIGS. 5A-C and 13-14 as well as the effect of inserting the special initialization value between a block of 0-valued initialization bits and the remainder of the message. The two-byte representation 1516 of the expression $$\sum_{i=n}^{2n-1} x^i$$

is again shown at the top of FIG. 16. Modulo-2 division over GF(2) produces the special initialization value 1602 for the CRC polynomial according to expression 1512 in FIG. 15. A representation of the message with leading 0-valued initialization bits 1604, equivalent to representation 1510 shown in FIG. 15, and the beginning of the CRC-code calculation 1606 are shown in the lower portion of FIG. 16. The bit "x" 1608, the first message bit, is brought down 1610 into the remainder 1611 of the 8th XOR operation and the CRC polynomial 1612 is aligned for the next XOR step. A representation of the message with leading 1-valued bits 1616, equivalent to representation 1508 in FIG. 15, is shown to the right of the representation of the message with leading 0-valued initialization bits with the CRC polynomial 1618 aligned for the first XOR step of the CRC-code computation. Comparing this first XOR step for the representation with 1-valued initialization bits to the $9^{th}$ XOR step (1610-1612) for the representation with 0-valued initialization bits reveals that the state of the computations is identical at these two respective steps. Since the remaining XOR steps are identical, the results produced by module-2 division over GF(2) will be identical. Thus, introduction of the special initialization value 1620 between the block of 0-valued initialization bits and the message results in generating an intermediate step (1610-1612) in the CRC-code computation that is identical to the first step (1616-1618) of the CRC-code computation for the case where 1-valued initialization bits are used. Padding, or prepending, the message with the special initialization value allows 0-valued initialization bits to be used to produce the same result produced 1 1-valued when initialization bits are used without a prepended special initialization value. It should be noted that there are a variety of methods for computing the special initialization value for a given CRC-code-computation circuit. When different CRC-computation methods and corresponding XOR matrices and logic are used, the special initialization value is generally differently computed than the computation of the special initialization value discussed above. However, as shown by the examples discussed in this document, a special initialization value can be determined for whatever CRC-code-computation method, and accompanying hardware and logic, is used.

Figure 17:
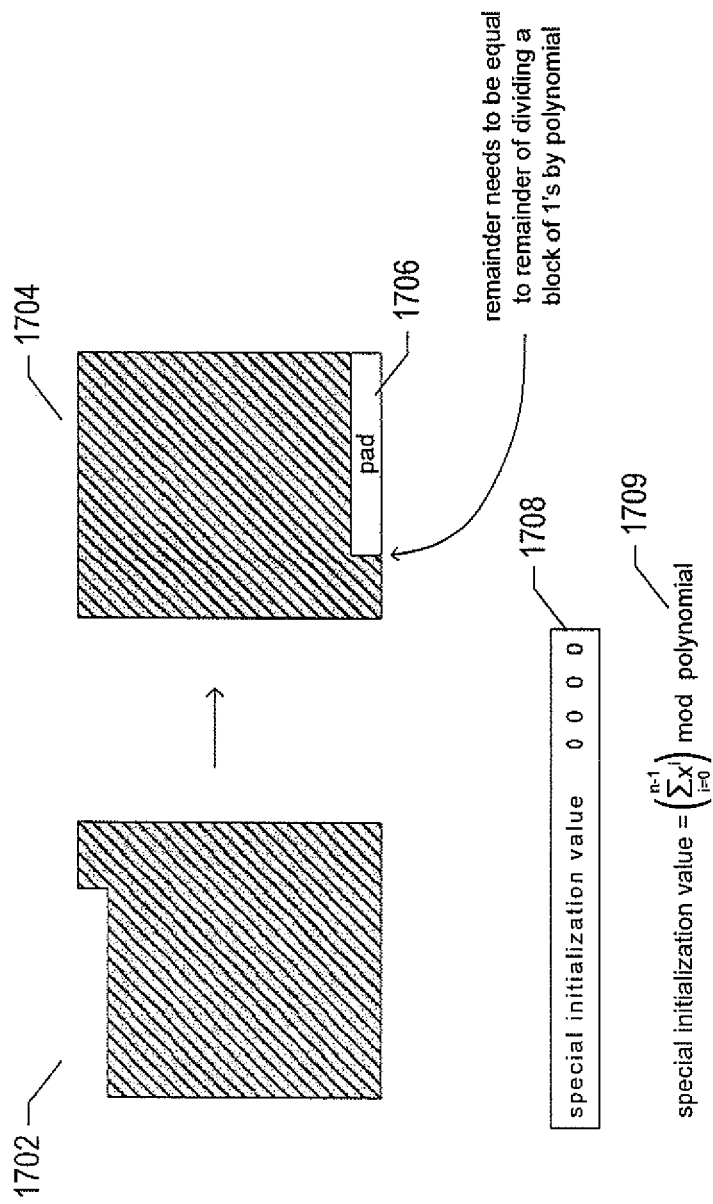
FIG. 17 illustrates the padding approach used in certain of the currently disclosed CRC-code-computation-circuit implementations.

FIG. 17 illustrates the padding approach used in certain of the currently disclosed CRC-code-computation-circuit implementations. A message with a length that is not evenly divisible by the word size 1702 is shown on the left-hand portion of FIG. 17, using the same illustration conventions previously used in FIG. 8. As shown in diagram 1704, the original message is modified by introducing a number of padding bytes 1706. The padding bytes include leading 0-valued bits followed by the special initialization value 1708. Any number of leading 0-valued bits does not affect the results of the CRC-code computation. The special initialization value produces a remainder equal to the remainder that would be produced by application of the CRC-code computation method to a block containing all 1-valued bits, as discussed above with reference to FIGS. 13-14. This assumes that the lower-order message bytes are first submitted to the XOR matrix. In alternative implementations, the higher order message bytes may be first submitted. Whatever submission order is used, the padding bytes need to precede the special initialization value and message bytes. Again, the order in which message bytes are processed is immaterial, provided that the same processing order is used for initial CRC-code computation and CRC-code recomputation.

Figure 18:
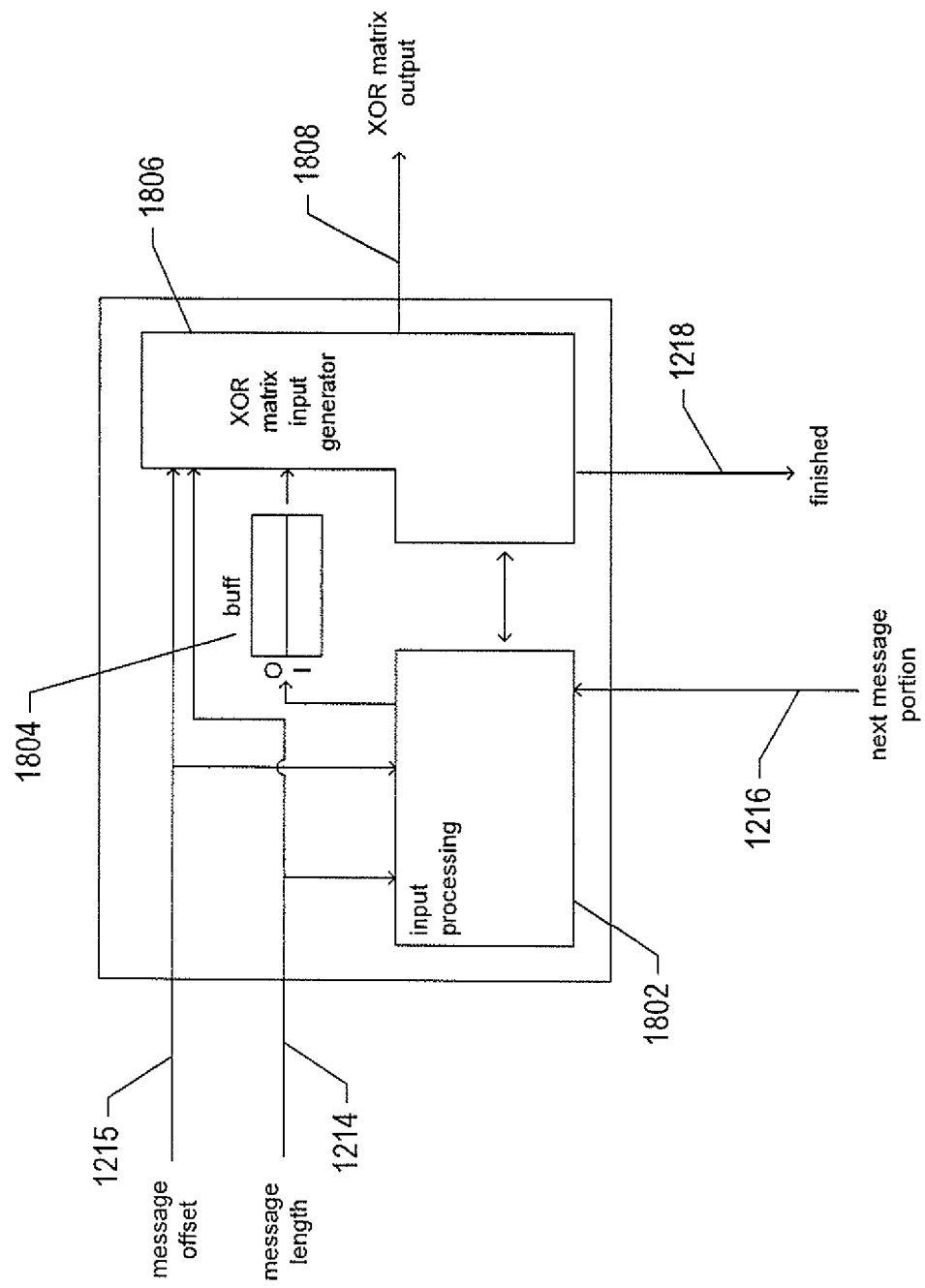
FIG. 18 provides additional details of the pad-logic component (1212 in FIG. 12).

FIG. 18 provides additional details of the pad-logic component (1212 in FIG. 12). The 3 inputs 1214-1216 and the finished output 1218 are again shown in FIG. 18, as in FIG. 12. Within the pad-logic component, an input-processing logic component 1802 receives input words containing message data and outputs word-aligned message data to a pair of buffers 1804 buff [0] and buff [1]. The word-aligned message data is input to a CRC XOR matrix-input generator 1806 which outputs words to the XOR matrix via output 1808. The input-processing logic component extracts data over which the CRC code is to be computed from an input message, beginning with the byte indicated by the message-offset input 1215 as the offset for the data over which the CRC code is to be computed. The XOR matrix-input generator 1806 adds padding, as needed, and a special initialization value to the extracted data to generate padded data, word-by-word, that is output word-by-word to the XOR matrix.

Figure 19A:
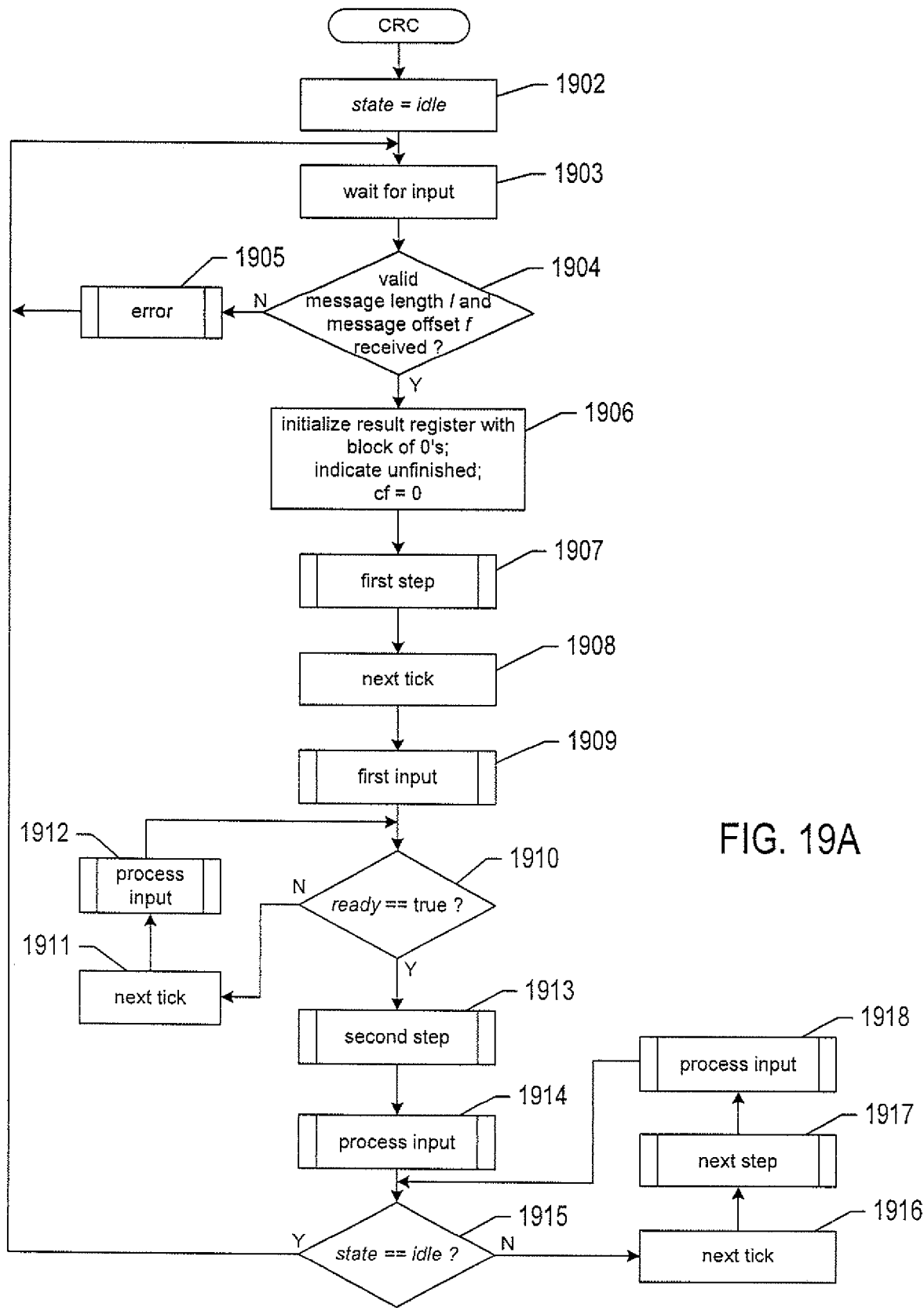
FIGS. 19A-G provide control-flow diagrams that illustrate logical operation of the pad-logic circuit (1212 in FIG. 12).

FIGS. 19A-G provide control-flow diagrams that illustrate logical operation of the pad-logic circuit (1212 in FIG. 12). These control-flow diagrams illustrate operation of the logic as if it were a routine. Of course, a circuit implementation would be differently implemented, but would produce analogous operational results. FIG. 19A provides a control-flow diagram for CRC-code computation. In step 1902, a variable state, which stores a current state of the pad logic, is set to the value idle. In step 1903, the pad logic waits for an input. When input is detected, and when the input values fail to include a valid message length l and a valid message offset f, as determined in step 1904, the error condition is handled by error logic in step 1905. Otherwise, in step 1906, the pad logic initializes the result register with a block of 0-valued bits, sets the output to indicate that the CRC computation has not finished, and initializes a current-offset variable cf to 0. Next, a routine "first step" is called, in step 1907, to begin computation of the pad value that is added to the message. After passage of a clock cycle, represented by step 1908, a routine "first input" is called, in step 1909, to begin input processing by the input-processing logic component (1802 in FIG. 18). When the routine "first input" has not yet set the value of the variable ready to TRUE, as determined in step 1910, a routine "process input" is called, in step 1912, to continue processing incoming data after passage of the next clock cycle, as represented by step 1911. The routine "process input" is continuously called in the loop of steps 1910-1912 until word-aligned data is available for processing by the XOR matrix-input generator (1806 in FIG. 18). The availability of word-aligned data is indicated by the variable ready containing the Boolean value TRUE. Once word-aligned data is available for processing, a routine "second step" is called, in step 1913. The routine "second step" completes pad generation and begins processing of the first input message block. Then, the routine "process input" is called, in step 1914, to process another word of data input through the next-message-portion input (1216 in FIG. 12). When the state of the pad logic is idle, as determined in step 1915, CRC-code computation is complete, and control returns to step 1903, to await subsequent input. Otherwise, after a next clock cycle, as represented by step 1916, the routine "next step" is called to continue processing of message blocks, in step 1917, followed by an additional call to the routine "process input," in step 1918. The routines "next step" and "process input" continue to be called until all of the message blocks have been consumed and processed.

Figure 19B:
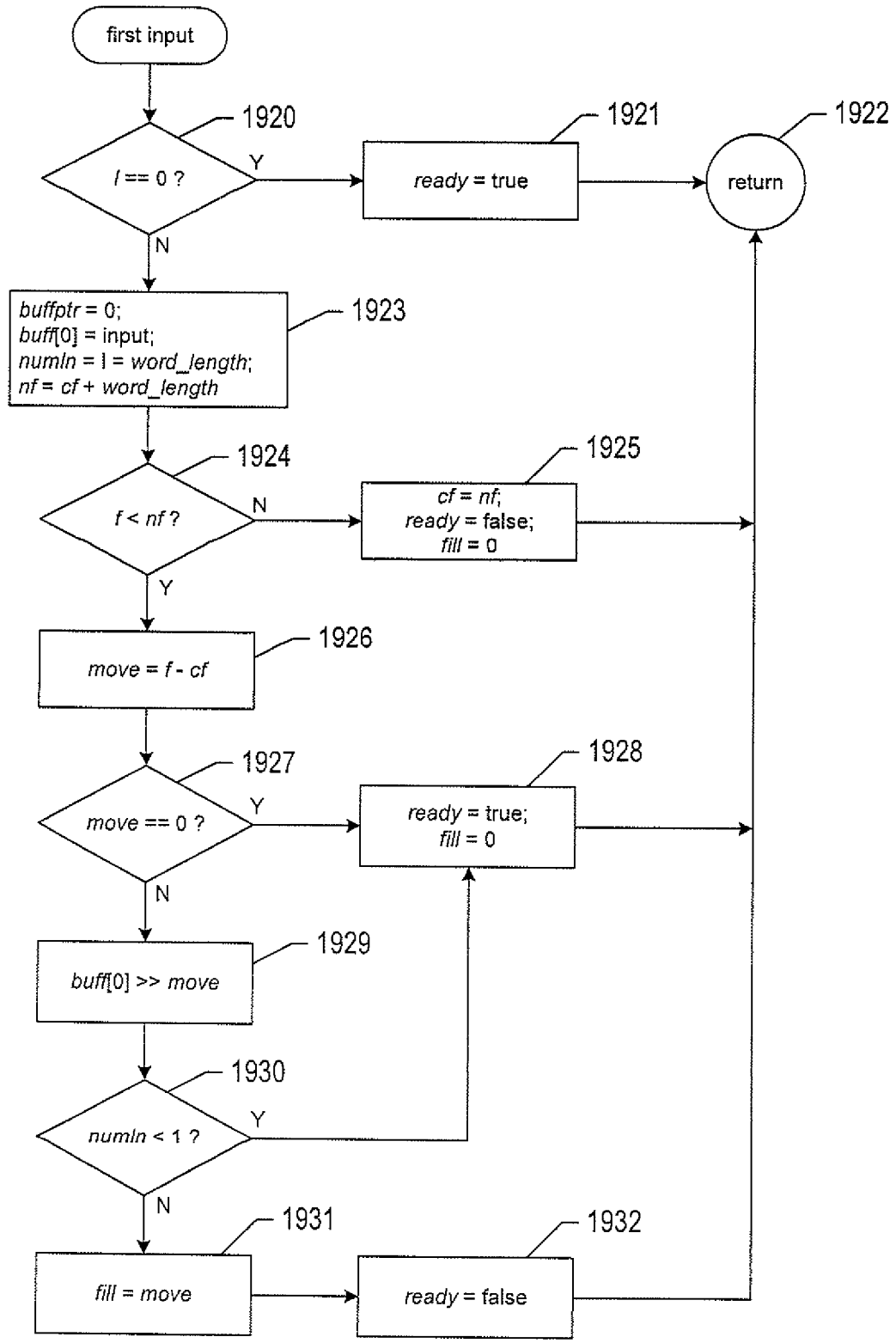

FIG. 19B provides a control-flow diagram for the routine "first input" called in step 1909 of FIG. 19A. When the input message length l is 0, as determined in step 1920, the variable ready is set to the value TRUE, in step 1921, and the routine "first input" returns 1922 since, when there is no message data, the input-processing logic has no tasks to carry out. Otherwise, in step 1923, the variable buffptr is set to 0, the first input value is stored in the buffer buff[0], the variable nimIn is set to the message length minus the word length, and the variable nf is set to the sum of the value stored in the variable cf and the word length. When the input offset f is greater than or equal to the value stored in variable nf, as determined in step 1924, the value stored in the variable nf is copied to the variable cf, the variable ready is set to FALSE, and the variable fill is set to 0 in step 1925, after which the routine "first input" returns. An input word prior to the byte identified by the input offset value f is essentially discarded by the routine "first input." Otherwise, in step 1926, the variable move is computed as the difference between the input offset f and the value stored in the variable cf. When the variable move has the value 0, as determined in step 1927, then, in step 1928, the variable ready is set to TRUE and the variable fill is set to 0, after which the routine "first input" returns. When the variable move has the value 0, the message data over which the CRC code is to be computed is word aligned, as a result of which the buffer buff[0] contains the first word of data to be processed by the CRC XOR-matrix input generator. Otherwise, the contents of buff[0] are right shifted with 0 fill by move bytes, in step 1929. When there is no additional input, as determined in step 1930, control flows to step 1928. Otherwise, in step 1931, the variable fill is set to the contents of the variable move and, in step 1932, the variable ready is set to FALSE, since additional input is needed to complete the first word of data stored in buff[0].

Figure 19C:
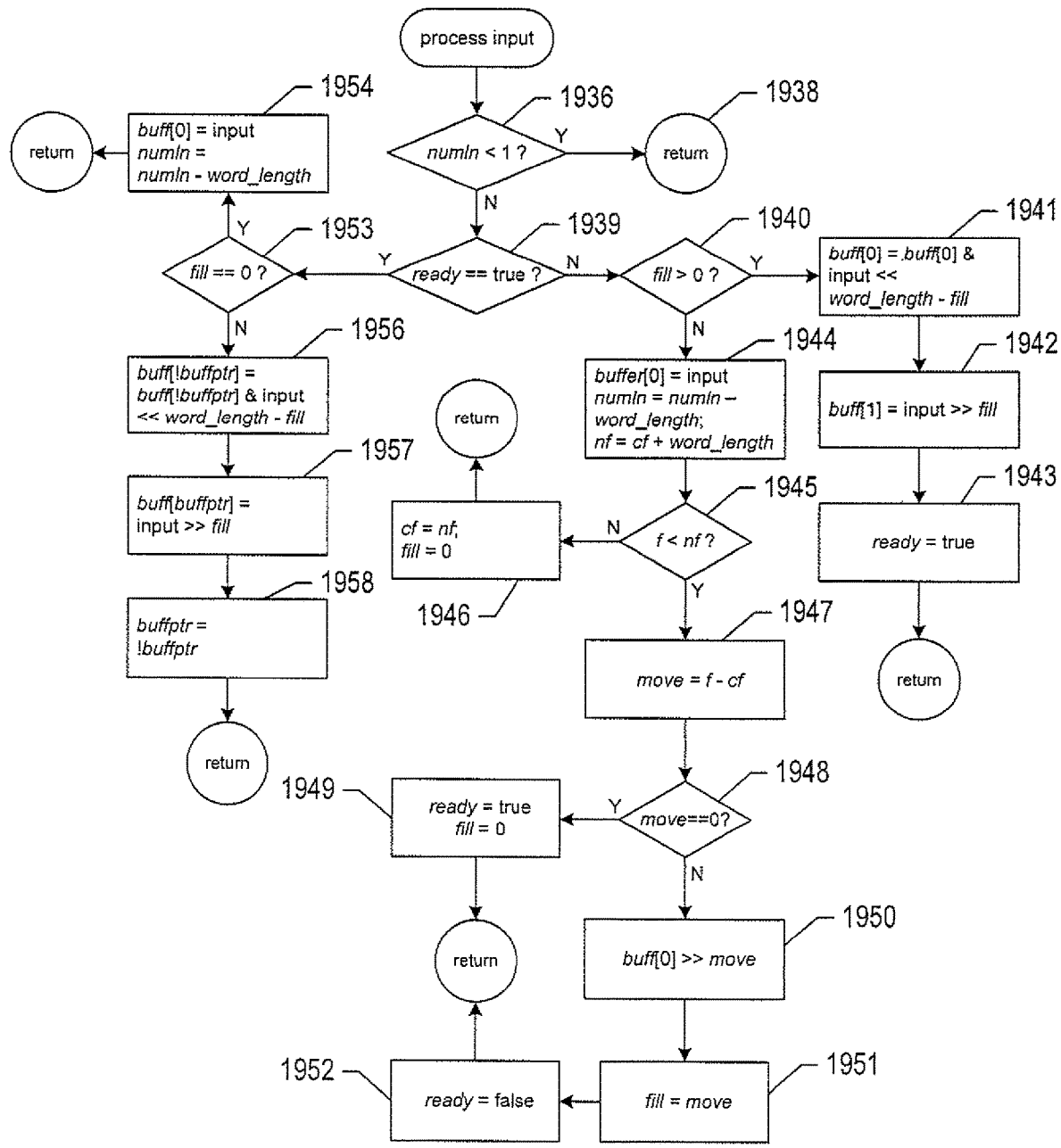

FIG. 19C provides control-flow diagram for the routine "process input," called in steps 1912, 1914, and 1918 of FIG. 19A. When there is no further message-data input, as determined in step 1936, the routine "process input" returns 1938. Otherwise, when the variable ready has the value FALSE, as determined in step 1939, and when the variable fill is a value greater than 0, as determined in step 1940, the lower portion of the next input word is used to complete the contents of buff[0], in step 1941, and the upper portion of the next input word is stored in the buffer buff[1], in step 1942. In step 1943, the variable ready is set to TRUE and the routine "process input" then returns. When the variable fill has the value 0, as determined in step 1940, steps 1944-1952 essentially repeat the logic of steps 1924-1932 in FIG. 19B, discussed above. When the variable ready has the value TRUE, as determined in step 1939, and when the variable fill has the value 0, as determined in step 1953, the next input word is read into the buffer buff[0] and the variable numIn is decremented by the word length, in bytes, in step 1954. When the variable fill has a value other than 0, as determined in step 1953, the lower portion of the next input word is used to complete the data stored in the buffer not currently indexed by the variable buffptr, in step 1956, and the upper portion of the next input word is stored in the buffer currently indexed by the variable buffptr, in step 1957. The value stored in the variable buffptr is then inverted, in step 1958.

Figure 19D:
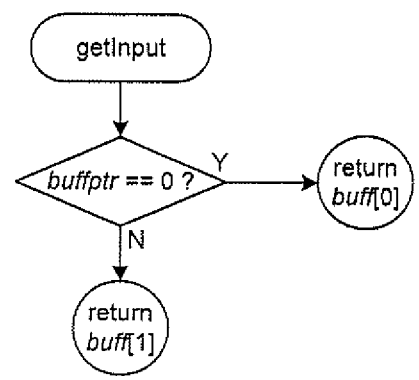

FIG. 19D provides a control-flow diagram for a routine "getInput." This routine returns the value stored in the buffer indexed by the variable buffptr.

Figure 19E:
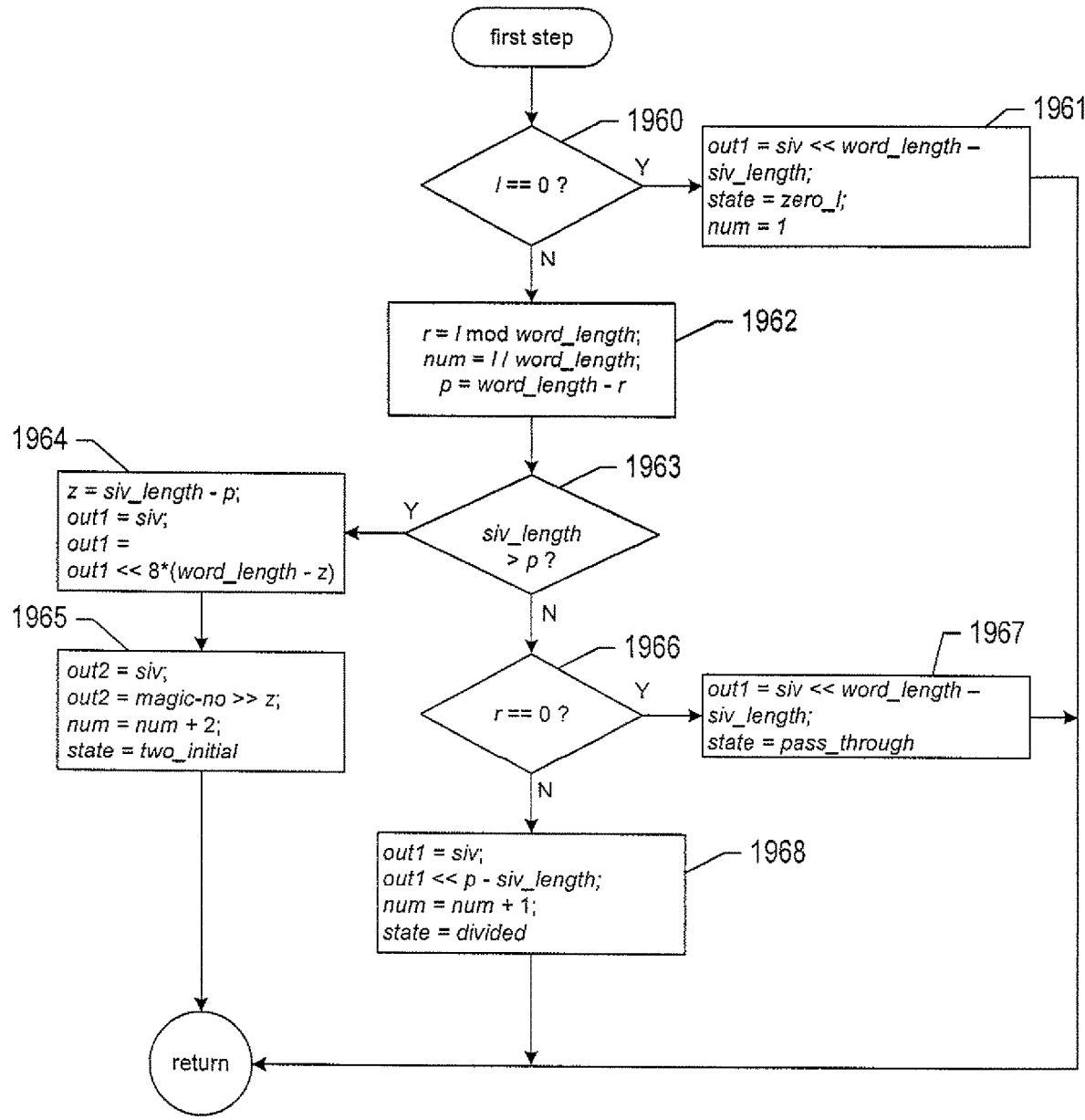

FIG. 19E provides a control-flow diagram for the routine "first step," called in step 1907 of FIG. 19A. When the input message length is 0, as determined in step 1960, the local variable out1 is initialized with the special initialization value for the CRC computation, the pad-logic state is set to the value zero_l, and a local variable num is set to the value 1, in step 1961. The local variable num indicates the number of clock cycles remaining to process the message and produce a CRC code. For a message of 0 length, only a single additional clock cycle is needed. When the length of the message is not 0, then, in step 1962, a number of parameters are computed, including: r, the number of final bytes in the final word of the message, when the message is not evenly divisible by the word length; num, the number of words in the message to process; and p, the length, in bytes, of the padding. When the length of the special initialization value is greater than p, as determined in step 1963, the padding spans two words. The first all-padding word is computed, in step 1964, and stored in the variable out1. The second word, which contains both padding and a portion of the message, is computed in step 1965 and stored in the variable out2. The first, all-padding word is computed, in step 1964, by setting the variable z to the number of special-initialization-value bytes that do not fit in the initially computed padding length p. The variable out1 it is initialized to contain the special initialization value and is then left shifted, with 0 fill, to leave the bytes of the special initialization value that did not fit in the initial padding of length p in the first padding word. The variable out2 is initialized, in step 1965, to contain the special initialization value. The value in variable out2 is then right shifted so that the value in variable out2 contains the low-order bytes of the special initialization value that can be accommodated in a length of bytes p, leaving space in the high-order portion of the word to contain the first bytes of the message. In addition, the variable num is incremented by 2, because two additional words need to be processed, and the pad-logic state is set to two_initial. When the length of the special initialization value is less than or equal to p, as determined in step 1963, and when r is 0, as determined in step 1966, indicating that the message length is evenly divisible by the word length, then, in step 1967, the single word of padding, stored in the variable out1, is set to the special initialization value, with leading 0 bits, and the pad-logic state is set to the value pass_through. When r does not have the value 0, as determined in step 1966, then, in step 1968, the variable out1 is initialized to the special initialization value and then left shifted to add leading 0 padding bits. The variable num is incremented by one, since an extra word containing padding needs to be processed and the pad-logic state is set to the value divided.

Figure 19F:
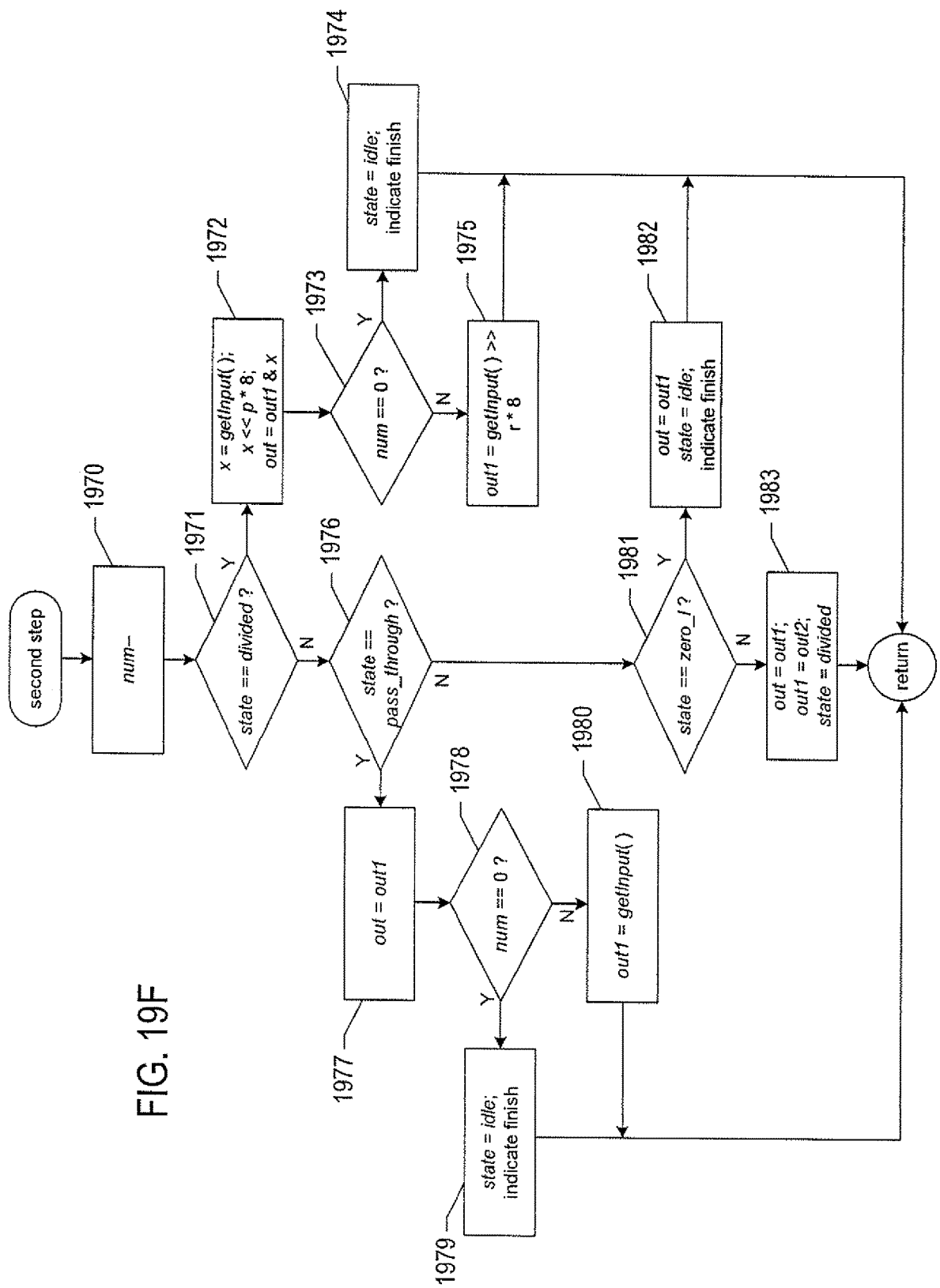

FIG. 19F provides a control-flow diagram for the routine "second step," called in step 1913 of FIG. 19A. In step 1970, the variable num is decremented. When the pad-logic state has the value divided, as determined in step 1971, the first input message block is copied to the variable x, in step 1972, is then left shifted with 0 fill, and is finally pairwise ANDed with the value stored in variable out1 and output to the XOR matrix. When the value of the variable num is now 0, as determined in step 1973, the pad-logic state is set to idle, in step 1974, and the pad logic outputs an indication that the CRC computation is finished. Otherwise, the upper portion of the input message block is selected by right shifting and placed in the variable out1, in step 1975. When the pad-logic state is pass_through, as determined in step 1976, the value in variable out1 is output to the XOR matrix, in step 1977. When the current value stored in the variable num is now 0, as determined in step 1978, the pad-logic state is set to idle, in step 1979, and the pad logic indicates that the CRC computation is complete. When the value stored in the variable num is not 0, as determined in step 1978, the currently received message block is stored in the variable out1, in step 1980. When the pad-logic state is zero_l, as determined in step 1981, the value stored in the variable out1 is output by the pad logic to the XOR matrix, in step 1982, the pad-logic state is set to idle, and the pad logic indicates that the CRC-code computation is complete. Otherwise, the pad-logic state is two_initial, in which case the value stored in the variable out1 is output to the XOR matrix, in step 1983, the value stored in variable out2 is copied to the variable out1, and the pad-logic state is set to divided.

Figure 19G:
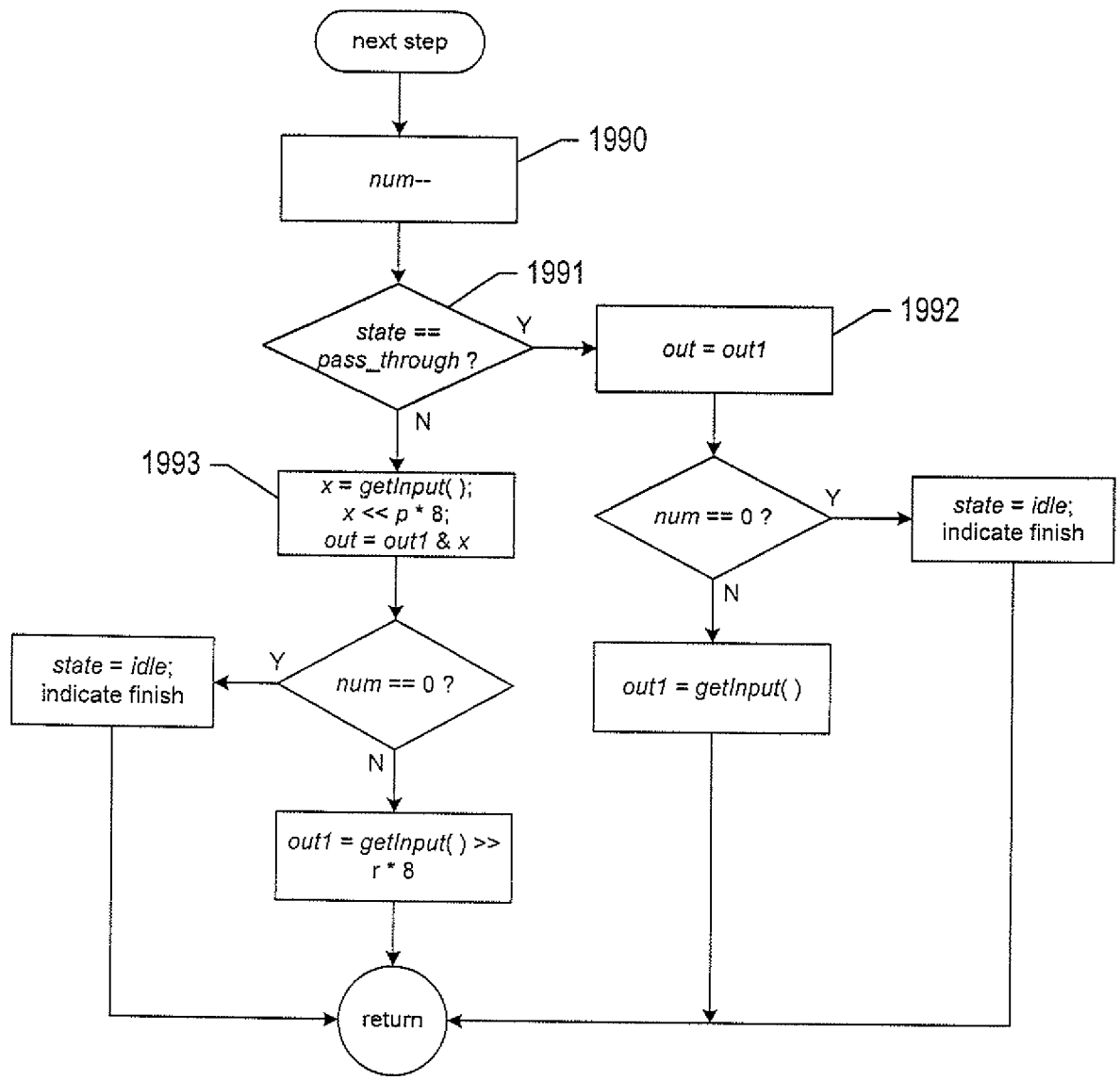

FIG. 19G provides a control-flow diagram for the routine "next step," called in step 1912 of FIG. 19A. This routine is similar to the routine "second step," a control-flow diagram for which is shown in FIG. 19F and discussed above. There are only two different pad-logic states remaining: pass_through and divided. In step 1990, the variable num is decremented. When the pad-logic state is pass_through, as determined in step 1991, control flows to step 1992, which is equivalent to step 1977 in FIG. 19F. Otherwise, control flows to step 1993, which is equivalent to step 1972 in FIG. 19F.

The present invention has been described in terms of particular embodiments, it is not intended that the invention be limited to these embodiments. Modifications within the spirit of the invention will be apparent to those skilled in the art. For example, any of many different implementations of the CRC-code-computation circuit can be obtained by varying various design and implementation parameters, including using different types of XOR implementations, different arrangements and types components, and varying the operational characteristics, including the computations carried out during each clock cycle in the number and types of inputs and outputs. As one example, rather than a separate initialization value that is input to the XOR matrix, the initialization value can be loaded into the output register prior to the first XOR operation. As another example, word alignment and message padding can be carried out by a single circuit component rather than by an input-processing component and an XOR-matric input generator. As a third example, a pair of offsets may be input to the pad-logic component in order to define the portion of the message over which to compute the CRC code. The currently disclosed CRC-code-computation circuit and method can be adapted for processing messages encoded in words of various different lengths using various different CRC polynomials and conforming to a variety of different types of CRC-code-computation standards.

The invention claimed is:

1. A cyclic-redundancy-check (CRC)-code-computation circuit configured to generate a CRC code for an indicated portion of a message comprising words, the CRC-code-computation circuit comprising:
    a single XOR matrix configured to process all the words of the message upon input through a first input;
    an output register configured to receive results produced by the XOR matrix; and
    a pad-logic component configured to:
        receive the message,
        extract message data upon which to compute the CRC code from the message,
        prepend padding to the message when necessary to align a byte-length of the message for even divisibility by a word byte-length, and
        output to the XOR matrix, word-by-word, the extracted message data with prepended padding.

2. The CRC-code-computation circuit of claim 1 wherein the pad-logic component is further configured to receive, in addition to the message,
    a message-offset input that specifies the first byte within the message upon which CRC-code computation is to be carried out; and
    a message-length input that specifies the number of bytes within the message.

3. The CRC-code-computation circuit of claim 2 wherein the pad-logic component is further configured to output an indication when CRC-code computation is complete and a result produced by the XOR matrix is ready for output from the output register.

4. The CRC-code-computation circuit of claim 1 wherein the output register is further configured to:
output an intermediate result to the XOR matrix; and
output a final result through an inverter to a CRC-code-receiving component.

5. The CRC-code-computation circuit of claim 1 wherein the XOR matrix is further configured to:
initially receive, as a second input, a word containing 0-valued bits; and
thereafter receive, as the second input, an intermediate result output by the output register.

6. The CRC-code-computation circuit of claim 1 wherein in addition to prepending padding to the message data when necessary to align a byte-length of the message for even divisibility by a word byte-length, the pad-logic component is further configured to prepend a special initialization value to the message data.

7. The CRC-code-computation circuit of claim 6 wherein the pad-logic component is further configured to compute the special initialization value as the remainder following modulo-2 division of a word containing all 1-valued bits, that is left-shifted with zero fill, by a CRC polynomial.

8. The CRC-code-computation circuit of claim 1 wherein the pad-logic component is further configured to receive the message word-by-word.

9. The CRC-code-computation circuit of claim 1 wherein the padding comprises one or more bytes containing only 0-valued bits.

10. The CRC-code-computation circuit of claim 1 wherein the XOR matrix is further configured to iteratively perform division of the message data with prepended padding and a prepended special initialization value by a CRC polynomial.

11. A method, embodied in a cyclic-redundancy-check (CRC)-code-computation circuit containing only a single XOR matrix having a characteristic special initialization value, that computes a CRC code for an input message, the method comprising:
receiving a message-offset input;
receiving a message-length input; and
iteratively
receiving a next message word,
processing the next message word, and
when a completely processed word is available, outputting the processed word to the XOR matrix, which outputs a result to an output register, until a final result has been output by the XOR matrix to the output register;
wherein the special initialization value is computed as the remainder following modulo-2 division of a word containing all 1-valued bits, that is left-shifted with zero fill, by a CRC polynomial.

12. The method of claim 11 wherein processing a next message word further comprises:
when the next message word is a first message word containing a message byte at an offset from the beginning of message equal to or greater than the received message-offset input, generating one or two initial words that are output to the XOR matrix prior to output of any additional processed words.

13. The method of claim 12 wherein, when two initial words are generated, the first initial word contains one or more leading 0-valued bits followed by a first portion of the special initialization value and is a completely processed word and the second initial word contains a second portion of the special initialization value and is an incompletely processed word.

14. The method of claim 12 wherein, when one initial word is generated, the initial word is one of:
an incompletely processed word that includes leading 0-valued bits followed by the special initialization value;
a completely processed word that includes leading 0-valued bits followed by the special initialization value; and
an incompletely processed word that includes the special initialization value.

15. The method of claim 12 wherein processing a next message word following generation of the one or two initial words further comprises:
when an incompletely processed word is available, extracting a first portion of the next message word for inclusion in the incompletely processed word to generate a completely processed word and using a second portion of the next message word as a next incompletely processed word; and
when an incompletely processed word is not available, using the next message word as a completely processed word.

16. The method of claim 11 wherein the final result is inverted when output from the output register to a CRC-code-receiving entity.

17. The method of claim 11 wherein a word containing 0-valued bits is output to the XOR matrix along with the first completely processed word output to the XOR matrix to produce a first result output to the output register.

18. The method of claim 11 wherein, following production of a first result by the XOR matrix, the contents of the output register are output to the XOR matrix along with a next completely processed word.

19. The method of claim 11 wherein the final result is produced by the XOR message when any initial words generated for the message and a final byte of the message with an offset greater than or equal to the received message-offset, indicated by the message-length input, has been included in a completely processed word output to the XOR matrix.

20. An electronic circuit that computes a CRC code for an input message, the apparatus comprising:
means for receiving a message-offset input;
means for receiving a message-length input;
means for prepending a special initialization value to the message, computed as the remainder following modulo-2 division of a word containing all 1-valued bits, that is left-shifted with zero fill, by a CRC polynomial; and
means for iteratively
receiving a next message word,
processing the next message word, and
when a completely processed word is available, outputting the processed word to the XOR matrix, which outputs a result to an output register,
until a final result has been output by the XOR matrix to the output register.

* * * * *